(12) United States Patent
Luk et al.

(10) Patent No.: US 7,210,818 B2
(45) Date of Patent: May 1, 2007

(54) FLEXIBLE LED LIGHTING STRIP

(75) Inventors: John F. Luk, Flushing, NY (US); Robert M. Altman, New Canaan, CT (US)

(73) Assignee: Altman Stage Lighting Co., Inc., Yonkers, NY (US)

( * ) Notice: Subject to any disclaimer, the term of this patent is extended or adjusted under 35 U.S.C. 154(b) by 0 days.

(21) Appl. No.: 10/950,843

(22) Filed: Sep. 27, 2004

(65) Prior Publication Data

US 2005/0162850 A1 Jul. 28, 2005

Related U.S. Application Data

(63) Continuation-in-part of application No. 10/227,710, filed on Aug. 26, 2002, now Pat. No. 6,846,094.

(51) Int. Cl.
*F21S 13/14* (2006.01)
*F21V 21/32* (2006.01)
*H05B 33/00* (2006.01)
*H01L 25/075* (2006.01)

(52) U.S. Cl. .................... 362/252; 362/231; 362/250; 362/800; 361/749

(58) Field of Classification Search ................ 362/252, 362/231, 249, 250; 361/749, 752
See application file for complete search history.

(56) References Cited

U.S. PATENT DOCUMENTS

| 6,067,013 | A  | * | 5/2000  | Pejic ........................... 340/321 |
| 6,158,882 | A  | * | 12/2000 | Bischoff, Jr. ................ 362/249 |
| 6,371,637 | B1 | * | 4/2002  | Atchinson et al. .......... 362/249 |
| 6,659,632 | B2 | * | 12/2003 | Chen ........................... 362/252 |
| 6,762,562 | B2 | * | 7/2004  | Leong .......................... 315/51 |

* cited by examiner

*Primary Examiner*—Alan Cariaso
(74) *Attorney, Agent, or Firm*—Myron Greenspan; Lackenbach Siegel, LLP

(57) ABSTRACT

A flexible lighting device includes an elongated flexible tube with a translucent tube shell and opposed tube ends and a flexible circuit board set in the tube so that it extends between the tube ends. The flexible circuit board has opposed interior and exterior surfaces. Electrical circuitry is mounted to the circuit board and connected to an external input source and an output source of electrical power. The circuit board defines a number of cut-outs, preferably those of a generally diamond shape. The device is described in two embodiments: one with inwardly directed LEDs on the circuit board directed into the tube and one with outwardly directed LEDs on the circuit board directed out of the tube. The method of making the flexible lighting device is also described.

34 Claims, 23 Drawing Sheets

SECTION II-II

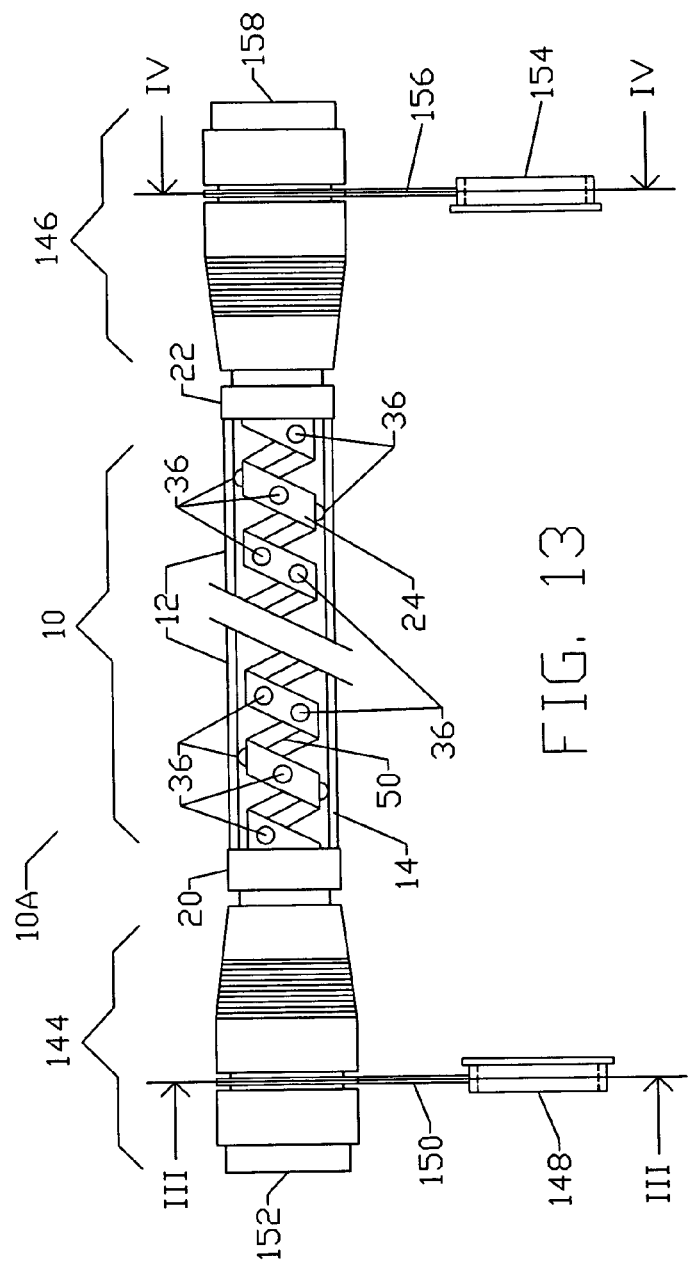
FIG. 13
SECTION III-III
FIG. 13A
SECTION IV-IV
FIG. 13B

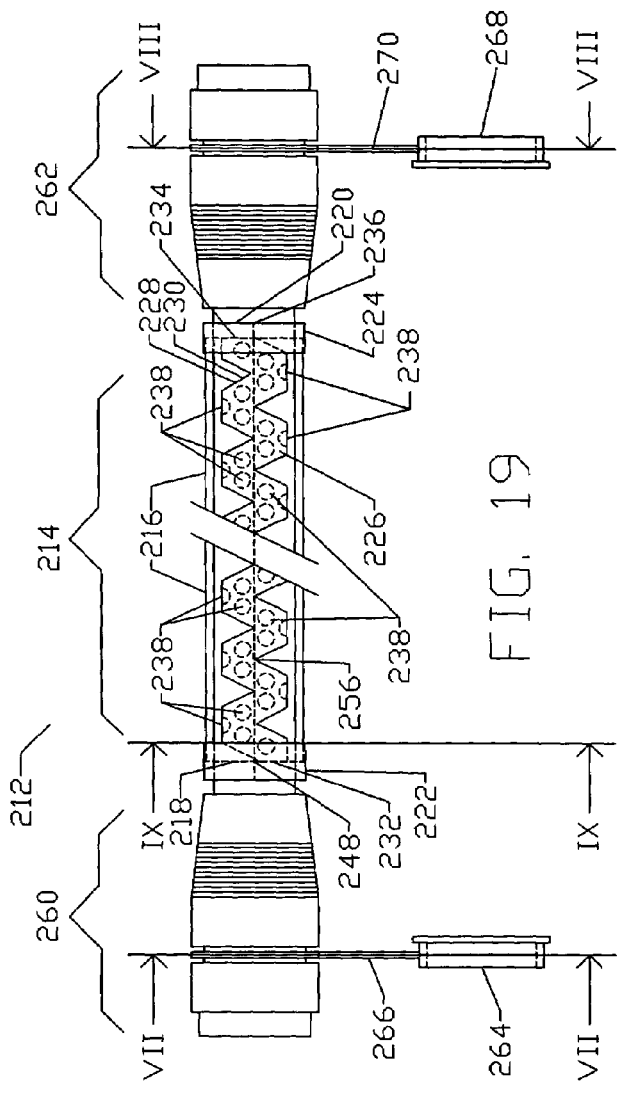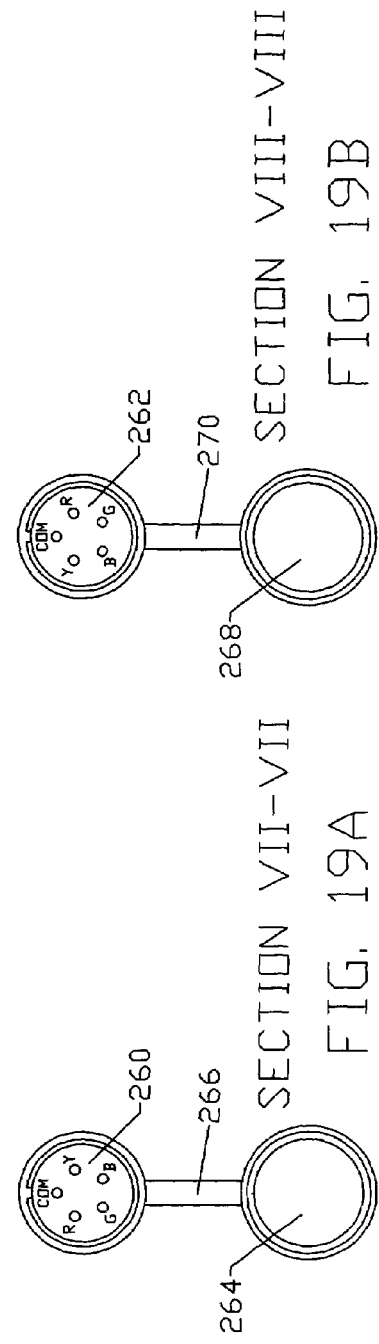

SECTION IX-IX

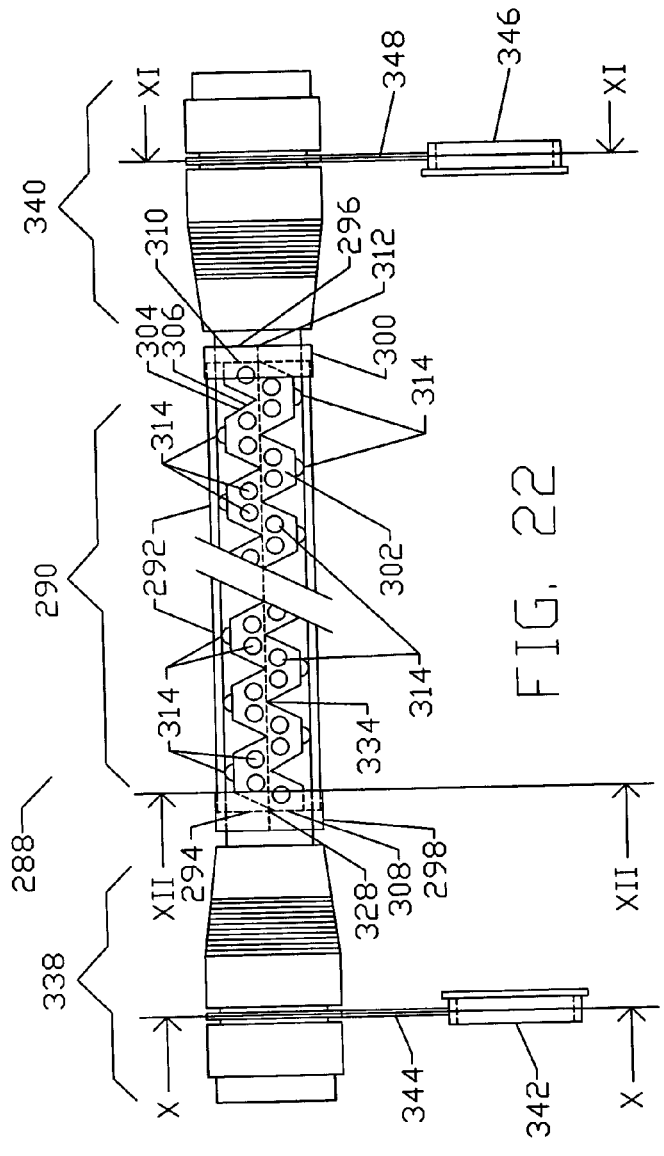
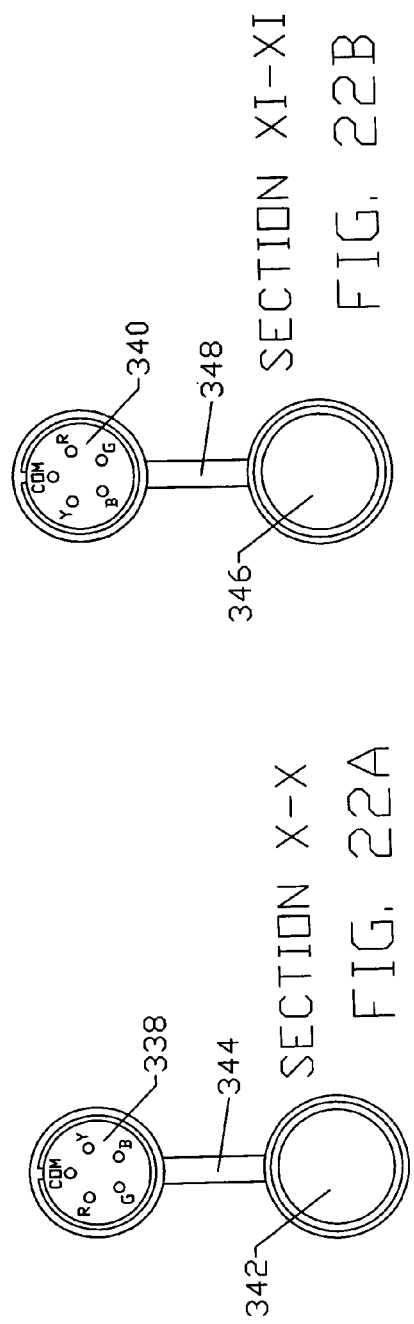
FIG. 22
FIG. 22A SECTION X-X
FIG. 22B SECTION XI-XI

SECTION XII-XII

FLEXIBLE LED LIGHTING STRIP

CROSS-REFERENCE TO PRIOR APPLICATION

This application is a continuation-in-part (CIP) of application Ser. No. 10/227,710 filed on Aug. 26, 2002, now U.S. Pat. No. 6,846,094, entitled "Flexible LED Lighting Strip."

BACKGROUND OF THE INVENTION

1. Field of the Invention

This invention is directed to flexible lighting strips for rope lighting, cove lighting, and signage applications.

2. Description of the Prior Art

Flexible lighting strips, also called rope lights, are used for lighting both interior and exterior structures and can be used for sign applications. Existing lighting strips do not allow a combination of flexibility and rigidity desired by users to configure rope lights into any selected configuration with ease. Color chasing and color mixing capabilities are limited.

Prior art in the sign industry includes the utilization of neon lamps, fluorescent lamps, and incandescent lamps. The drawbacks for neon and fluorescent lamps include difficulty in starting in cold temperatures, dangerous high-voltage operation, and the presence of mercury that in turn creates an environmental hazard. Incandescent lamps generate a large amount of heat, have poor resistance to vibration, have short lamp life, and consume large amounts of energy with the result that most of their light energy is wasted as infrared heat energy.

Light emitting diode (LED) technology makes possible the replacement of short lamp life with longer lamp life and energy deficient light sources using energy efficient light sources that are long lived and cooler running. Color output LEDs can emit red (R), green (G), blue (B), and yellow (Y) light, or white light. Brighter color mixing with better color rendering than in prior art technology is a result. Color additive mixing of LEDs can produce the secondary colors cyan (C), yellow (Y), magenta (M) and white light. Mixing green and blue gives cyan. Mixing green and red gives yellow. Mixing red and blue gives magenta. Mixing RGB plus a separate Y generates a truer white light with better color rendering than just combining RGB.

It is noted that color gel filters are not necessary with RGBY color mixing light technology, which in itself generates the full light spectrum. Color efficiency in LEDs is much better than incandescent filament lamps, which require a specific color gel or filter. This can waste up to about 90 percent of the light energy of incandescent lamps. LEDs on the other hand deliver 100 percent of their energy as light and further emit a more intense selected colored light. This energy efficiency of LEDs extends to the emitting of white light as well. There are two ways of using LEDs to produce white light in this invention: 1) using LEDs that produce white light exclusively, or 2) using LEDs to emit RGBY at the same time and at equal output intensities.

Besides generating less heat, LEDs are more energy efficient, more durable, and last longer than conventional light sources. The solid state design of LEDs makes them durable and robust and gives them the capability of withstanding shock, vibration, frequent power cycling and operation in extreme cold and hot temperatures. LEDs have an average usable life of typically 100,000 hours or more when operated within design specifications. LEDs are mercury free. LED technology now includes multi-chip and multi-light LED arrays, so that LEDs are available in a wide range of colors in unique combinations. Clearly for many applications LEDs now compete directly with incandescent filament, neon, and fluorescent light sources.

In the preferred embodiment of the present invention, light emitting diodes in different colors can be mounted onto a flexible circuit board that is twisted into a helix and inserted into a flexible tubular housing. This unique combination of a flexible circuit board and a flexible tubular housing will allow for a more versatile and improved flexible shape retaining rope light and cove light. In addition, the ease of manufacturability and full 360-degree omni-directional and uniform light dispersion is very important.

In an alternate embodiment of the present invention, light emitting diodes in white and different colors are mounted onto a flat long flexible circuit board with multiple repeating cutouts preferably diamond shaped that extend through the circuit board substrate. The circuit board is then rolled into a cylinder with the LEDs mounted to the interior of the circuit board and pointing inwards into the cylinder or alternatively, the LEDs are mounted to the exterior of the circuit board and pointing outwards from the cylinder, or both. The entire cylindrical assembly is inserted into a flexible outer tubular housing. A stiffening member contained in the outer tubular housing and optionally on the flexible circuit board itself will allow the complete LED lighting strip to be flexible because of the diamond shaped cutouts provided on the flexible circuit board, and will allow for some rigidity and memory for proper installation and assembly of the complete flexible LED lighting strip. This unique combination of a flexible circuit board and a flexible tubular housing will allow for a more versatile and improved flexible shape retaining rope light, cove light, and signage light. In addition, this invention has ease of manufacturability and full 360-degree omni-directional and uniform light dispersion that is very important. Previous inventions have been developed to try and accomplish this task, but have not been successful.

Color Kinetic's iColor Accent, Cove, and Fresco line of LED fixtures are available only in rigid linear transparent or translucent housings that offer no flexibility or versatility at all. To achieve a circular arrangement, for example, multiple linear fixtures have to be aligned edge to edge to approximate the curved outline. The iColor Accent, Cove, and Fresco fixtures also use rigid circuit boards with the LEDs mounted perpendicular to the circuit boards, therefore the light dispersion output from the LEDs are generally in the forward direction offering only at most approximately 180 degrees of coverage.

Gelcore Lighting offers their Tetra LED System and Lumileds Lighting offers their Chip Strip Contour Lighting System for signage applications. Both systems consist of a series of individual LED modules mounted onto rigid circuit board disks. Each LED module that is mounted onto a rigid circuit board disk is attached by power leads to an adjacent similarly configured LED module and rigid circuit board disk, and so on. Although the power leads offer flexibility as far as configuring the location of the LED modules themselves, there is no overall protective housing for all the modules. Also, since the LEDs are mounted onto rigid circuit boards, again the light dispersion output from the LEDs are generally in the forward direction also offering only approximately no more than 180 degrees of coverage.

In U.S. Pat. No. 6,394,623 issued to Tsui May 28, 2002, a translucent flexible rope light is disclosed and methods of forming and using the same. The invention uses exposed main conductors consisting of multi-strand wire connected to a plurality of spaced-apart lights, both extending substantially in parallel for substantially the entire length of the rope light. A flexible sheath having a continuous annular shape encases the conductors and plurality of lights. Although this invention uses a flexible tubular housing, the plurality of lights are disclosed as discrete lights wired directly together in series with the main conductors and plurality of lights positioned in a physical parallel orientation with each other throughout the length of the rope light. This invention does not employ a flexible circuit board and the configuration will not allow for a full dispersion of light output from the plurality of lights as required.

In U.S. Pat. No. 6,394,626 issued to McColloch in May 28, 2002, a flexible light track for signage is disclosed consisting of a plurality of modules separately and mechanically connected to a flexible frame to which light emitting diodes and positive and negative leads are mounted to each module. The modules are designed to be mounted flat onto the flexible frame. As this invention was designed for signage use only, an integral flexible tubular housing is not included. As before, this configuration will not allow for a full dispersion of light output from each light emitting diode mounted to each module.

Lastly, in U.S. Pat. No. 6,406,166 issued to Ko Jun. 18, 2002, a chasing rope light using a flexible core tube with at least two separate series string of light emitting diodes each individually connected to a diode rectifier. This rope light was designed to operate on an alternating power source such that only one series string of light emitting diodes will turn on at a time, thereby creating the chasing effect. Although this invention calls for a flexible core tube housing, it also does not employ a flexible circuit board. The major disadvantage here being not all the light emitting diodes in the separate series strings can be turned on at the same time. This invention functions only as a chasing rope light.

A light emitting diode light apparatus in accordance with the present invention that is a substantial improvement over the prior art mentioned above will be appreciated by those skilled in the art from the following summary and detailed description of the invention.

SUMMARY OF THE INVENTION

An object of the present invention is to provide a flexible LED lighting strip that can accomplish the functions of known rope lights, cove lighting, and signage lighting with greater energy efficiency and omni-directional light dispersion with color mixing, color changing, and color chasing capabilities.

It is a further object of the present invention to provide a flexible LED lighting strip that is both flexible and versatile and capable of being configured into numerous configurations and of maintaining the selected configuration.

It is yet another object of the present invention to provide a method of manufacture of a flexible LED lighting strip that is efficient and cost effective.

LEDs are available in different shapes and sizes. The LEDs used in the following examples are high luminous intensity lamp types available from Nichia Corporation. They are also readily available from other sources among which are Gelcore Lighting LLC, a joint company comprising GE Lighting and EMCORE Corporation and Lumileds Lighting LLC, a joint venture between Agilent Technologies (formerly with Hewlett Packard) and Philips Lighting. The LEDs include the 5 mm discrete axial lead types and Surface Mount Device (SMD) LED devices.

A minor drawback at present is the individual retail price of a single white LED. The cost decreases a bit when purchasing in larger quantities, but the overall cost is still high. At the present time of this application a single white LED from Nichia Corporation will cost $0.70 even when buying in quantities of 100,000 pieces. The cost of using LEDs can be justified in view of the energy savings, their lower current draw, the low profiles that can be achieved, and their low operating temperature. LEDs are also maintenance free and have a longer lamp life. The price of individual LEDs will fall as their luminous intensity and performance will continue to increase.

In addition, the direct generation of colored light by the selection of the type of LED used will make redundant the need for colored lenses with consequent improvements in efficiency, visibility, and cost. One particular use is in display and general lighting applications, where the long life characteristics of LEDs, their suitability for repetitive switching, their low operating temperature, and their high efficiency all contribute to qualify them for such use.

Those skilled in the art will further appreciate the improvements and advantages relating to the use of LEDs combined with the present invention upon reading the detailed description, which follows in conjunction with the following drawings.

BRIEF DESCRIPTION OF THE DRAWINGS

FIG. 13 is a broken side view of the flexible lighting strip as fully assembled including a transparent tubular housing with a flexible helical circuit board with LEDs mounted thereon, opposed end caps, a male plug connector and an opposed female socket connector, and opposed dust cap covers;

FIG. 13A is an end view taken through line III—III in FIG. 13;

FIG. 13B is an end view taken through line IV—IV in FIG. 13;

FIG. 19 is a broken side view of another flexible lighting strip having a flexible circuit board with cutouts and inwardly directed LEDs mounted thereon that is shown in a fully assembled mode that includes opposed male and female electrical connectors;

FIG. 19A is an end view taken through line VII—VII in FIG. 19;

FIG. 19B is an end view taken through line VIII—VIII in FIG. 19;

FIG. 22 is a broken side view of another flexible lighting strip having a flexible circuit board with cutouts and outwardly directed LEDs mounted thereon that is shown in a fully assembled mode that includes opposed male and female electrical connectors;

FIG. 22A is an end view taken through line X—X in FIG. 22;

FIG. 22B is an end view taken through line XI—XI in FIG. 22;

DETAILED DESCRIPTION OF THE INVENTION

The present invention will now be described more fully with reference to the accompanying drawings where like numbers refer to like elements throughout.

Figure 1:
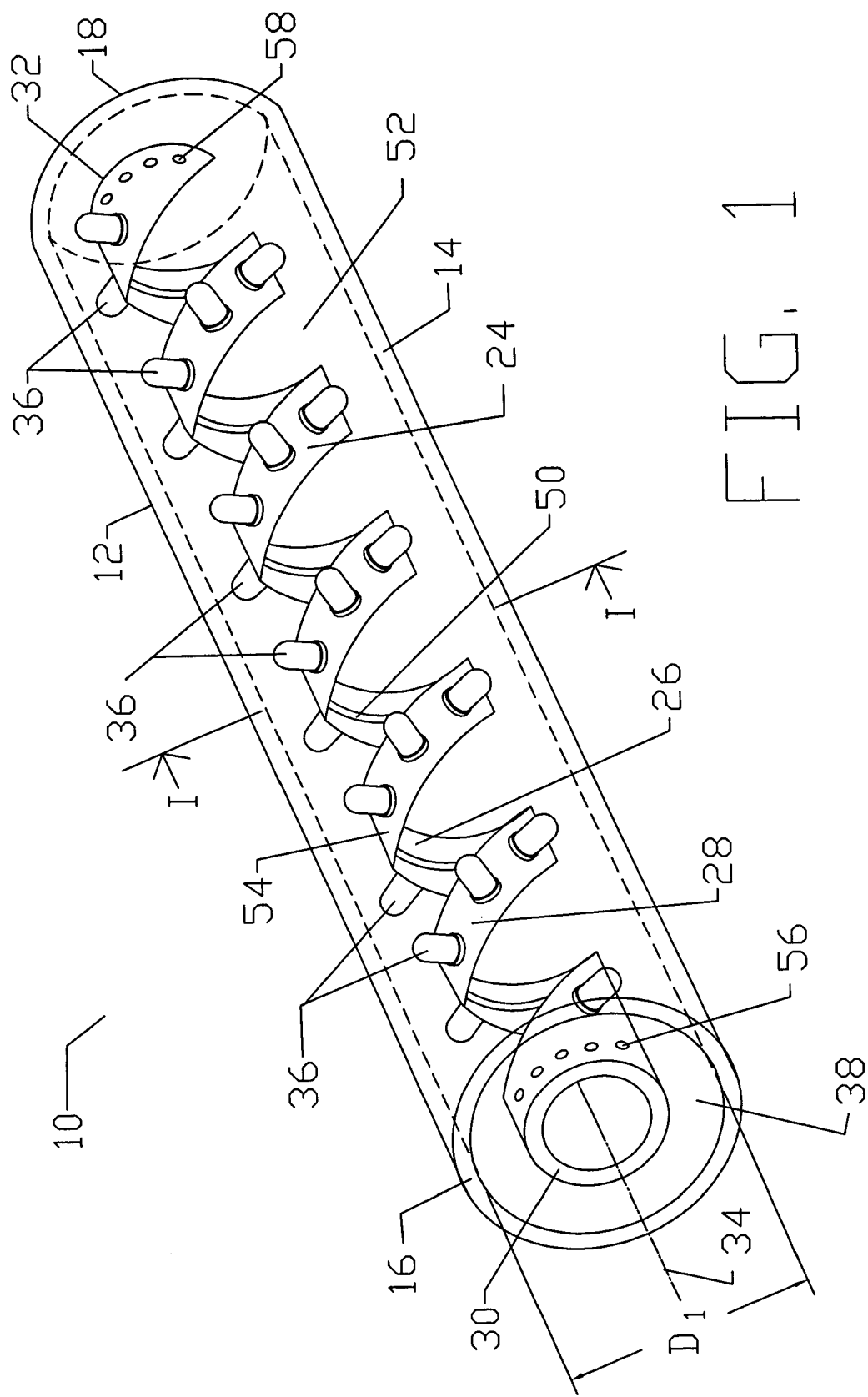
FIG. 1 is a perspective view of the flexible lighting strip in accordance with the present application.

A flexible lighting strip 10 is shown in FIG. 1. Flexible lighting strip 10 is a shortened version of a lighting strip of what is generally a more extended flexible lighting strip known in the art.

Flexible lighting strip 10 includes an elongated flexible tubular housing 12 having a smooth translucent shell, or in particular a transparent tubular shell 14 as shown, and opposed tubular ends 16 and 18 having connector end caps 20 and 22, respectively, (seen in FIG. 13) secured thereto and a flexible helical circuit board 24 configured as a open helix positioned in tubular housing 12. Flexible helical circuit board 24 is configured as a spiral helical spring having opposed continuous interior and exterior surfaces 26 and 28, respectively, and having helical circuit board opposed ends 30 and 32 positioned at tubular wall opposed ends 16 and 18, respectively. Flexible helical circuit board 24 and tubular housing 12 are both circular in cross-section and have a coextensive axis 34. A number of LEDs 36 are mounted on flexible helical circuit board 24 at equal intervals on exterior surface 28.

Figure 2:
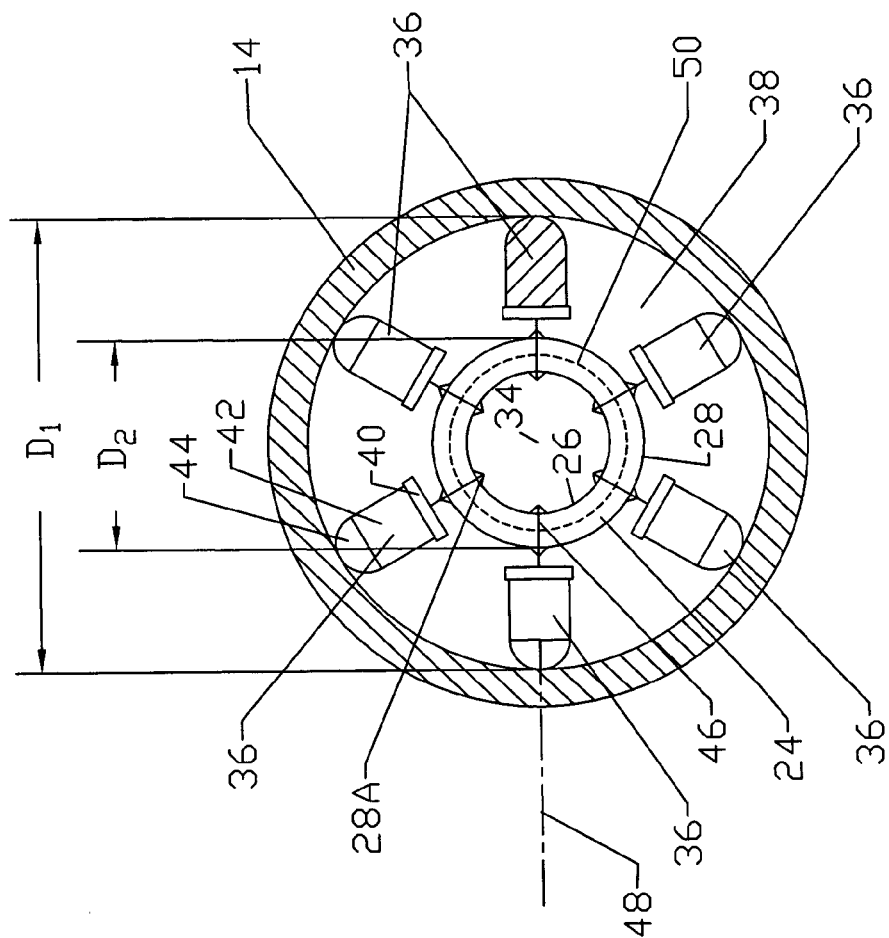
FIG. 2 is a view taken through plane I—I in FIG. 1 perpendicular to the axis of the flexible circuit board and the flexible tubular housing, through LEDs, and also showing a stiffening wire embedded in the flexible circuit board.

FIG. 2 shows a sectional plane I—I taken through flexible lighting strip 10 perpendicular to coextensive axis 34. A cylindrical space 38 is formed between flexible helical circuit board 24 and tubular shell 14. Each LED 36 includes a base portion 40, a body portion 42, and a lens portion 44. Each LED 36 has a LED centerline 48 that is perpendicular to coextensive axis 34. Lens portion 44 is adjacent to tubular shell 14. Stiff LED leads 46 mount LEDs 36 to flexible helical circuit board 24 and electrically connects LEDs 36 to the electrical connections on flexible helical circuit board 24. LEDs 36 are positioned in cylindrical space 38 with lens portions 44 being adjacent to tubular shell 14. LEDs 36 are so positioned and aligned that the six LEDs 36 shown in FIG. 2 are a result of the regular overlapping alignment of the total of LEDs 36 located on flexible helical circuit board 24.

Flexible helical circuit board 24 is preferably made of a polyimide plastic material that can withstand the high temperatures that can occur during the process of soldering LED leads 46 thereto. A thickness of approximately a minimum of 0.01 inches of polyimide material will allow the flexibility that is integral with flexible lighting strip 10, and in addition will offer the rigidity required to maintain the shape of flexible helical circuit board 24.

Figure 5:
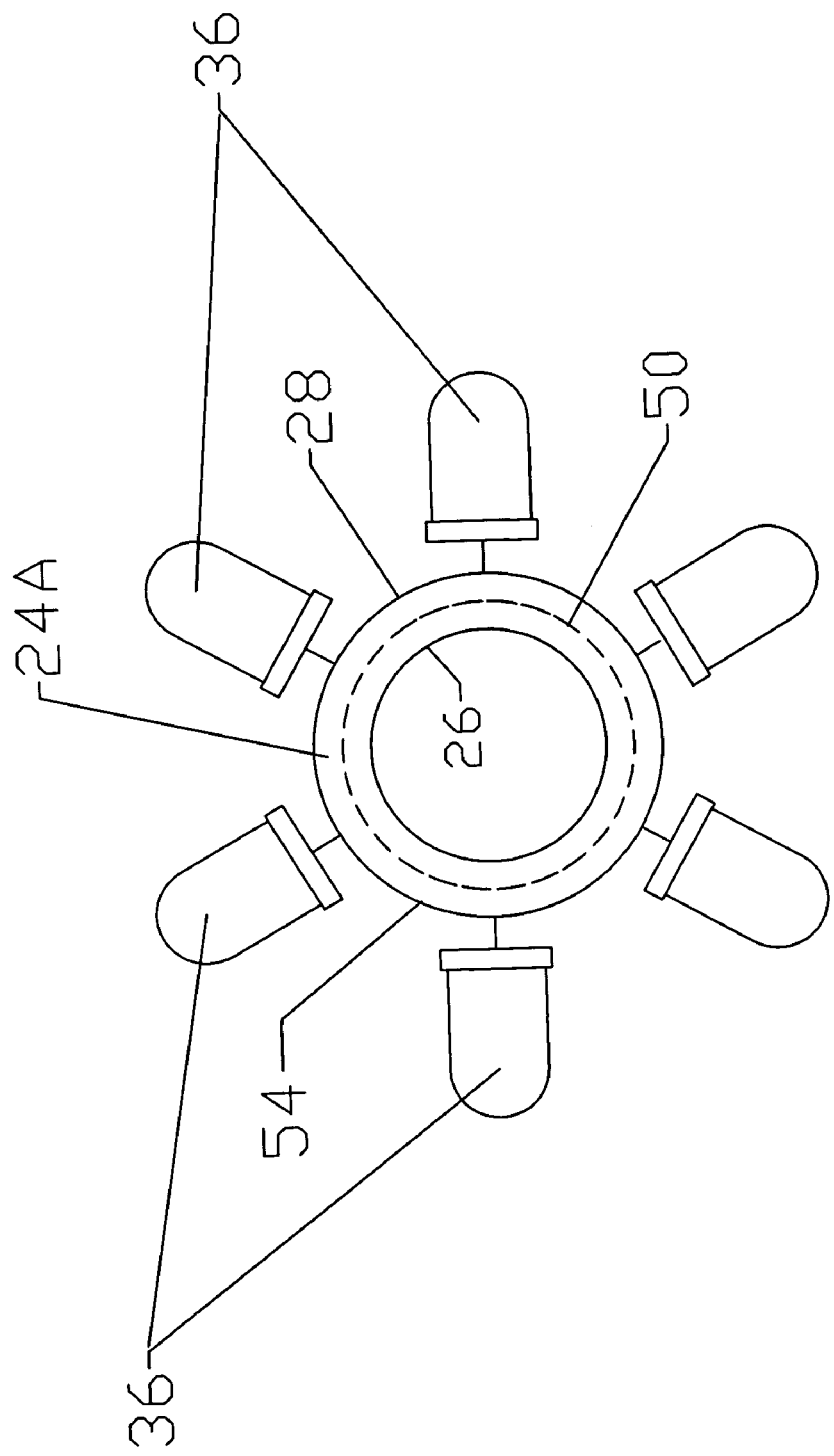
FIG. 5 is a view taken through plane II—II in FIG. 3 showing the stiffening wire.

A stiffening member particularly shown as stiffening wire 50 embedded the entire length of helical circuit board 24 between circuit board ends 30 and 32 is shown in FIG. 1 and further shown in a cross-section II—II of a single flexible spiral in FIG. 5 where stiffening wire 50 is positioned generally midway between interior surface 26 and exterior surface 28. It can be appreciated by someone skilled in the arts that the stiffening wire 50 can be positioned on interior surface 26 and/or on exterior surface 28. Stiffening wire 50 adds both added strength to flexible helical circuit board 24 and further provides the rigidity to maintain the entire flexible lighting strip 10 in the shape it is placed, for example, in a curved or looped mode, during the time of its use. Built-in stiffening wire 50 is made of metal for strength and rigidity, and as such can be electrically connected to the common or the negative DC voltage to each LED 36. Also, because stiffening member 50 is preferably made of metal, it can act as a heat sink to draw the heat generated by the LEDs 36 through the LED leads 46. LED leads 46 will extend through the entire flexible helical circuit board 24 from exterior surface 28 through interior surface 26 and held in place with solder 28A. Stiffening wire 50 is preferably made of an electrically conductive metal. Such electrically conductive metal can be, for example, substantially aluminum or copper.

Now, referring back to FIG. 3 shows compressed helical circuit board 24A in isolation prior to being inserted into tubular housing 12 in the manufacturing process, or assembly of flexible lighting strip 10. LEDs 36 are shown already connected to and positioned on compressed helical circuit board 24A, and also electrically connected to the electrical circuitry thereon in accordance with the electrical wiring diagrams shown in any of FIGS. 10, 11, and 12 as described later on.

Figure 3:
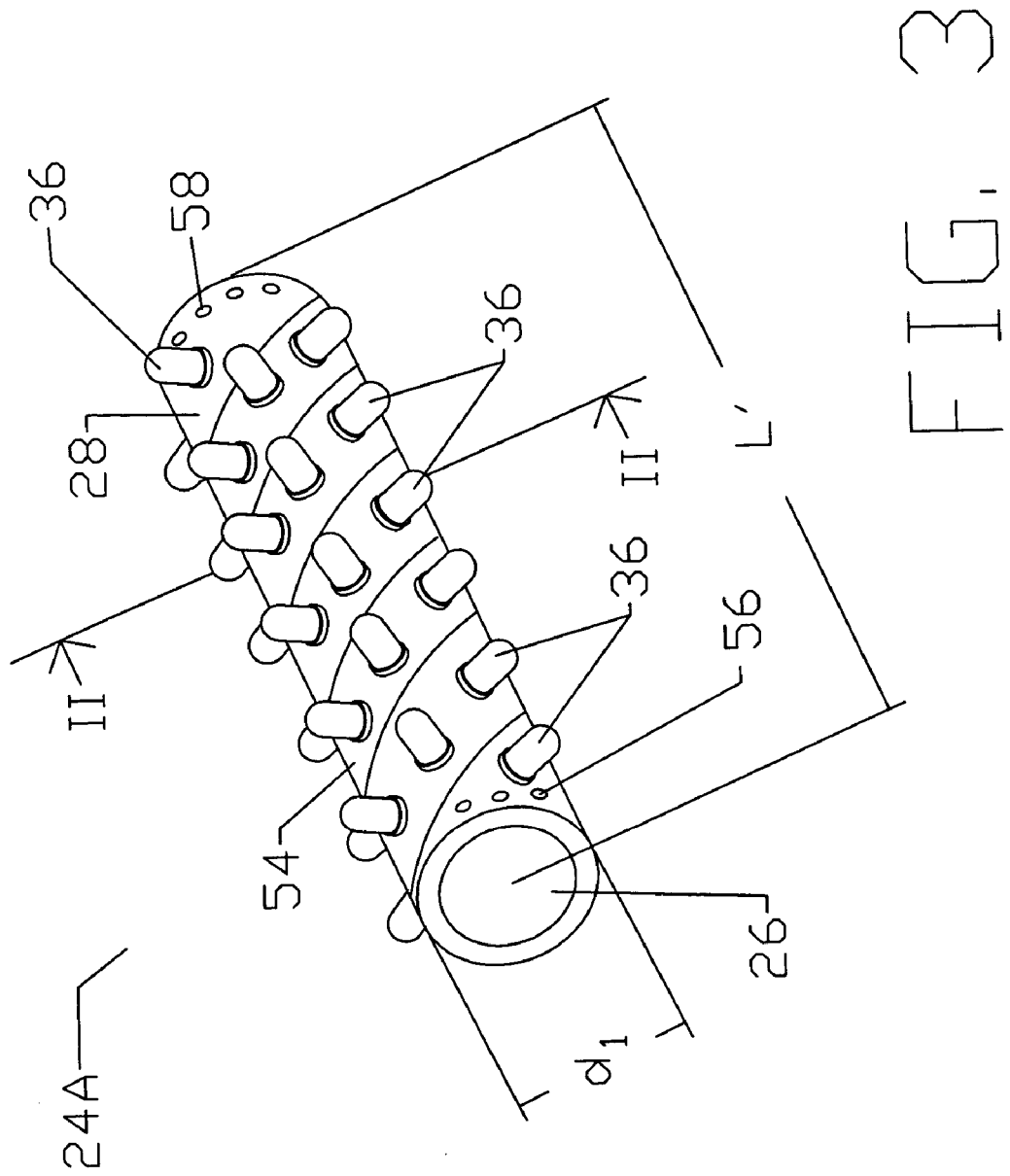
FIG. 3 is a perspective view taken in isolation of the flexible circuit board in a compressed mode with LEDs mounted thereon as shown in FIG. 1.
Figure 4:
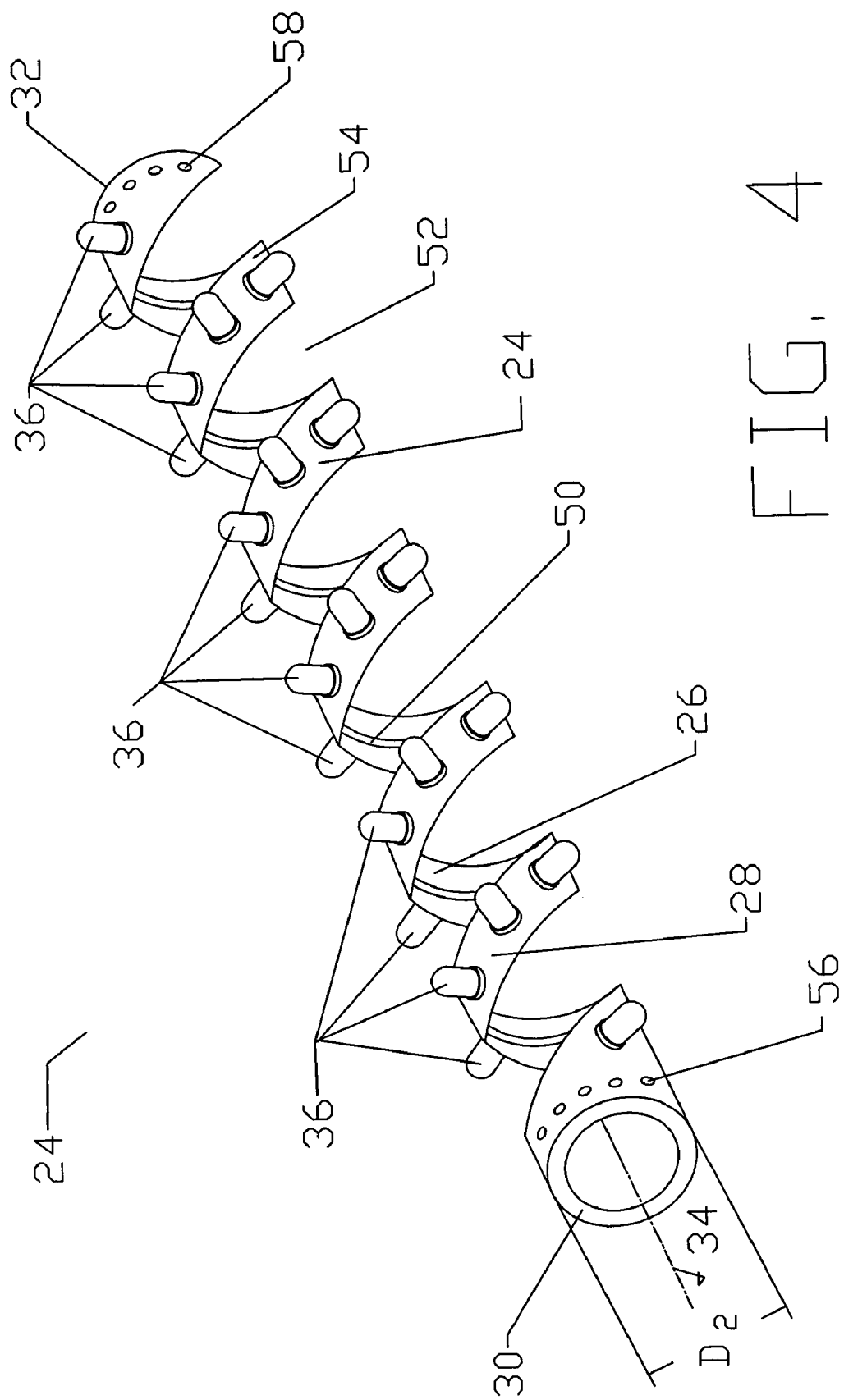
FIG. 4 is a perspective view taken in isolation of the helical flexible circuit board shown in FIG. 3 in the expanded mode in preparation for assembly.

In assembly, the compressed helical circuit board 24A, which is cylindrical in configuration as shown in FIG. 3, is pulled or extended into the uncompressed mode or configuration shown as flexible helical circuit board 24 in FIG. 4. The outer diameter $D_2$ of uncompressed flexible helical circuit board 24, which is shown in FIGS. 2 and 4, is reduced relative to the slightly larger diameter $d_1$ in the compressed helical circuit board 24A seen in FIG. 3. In the uncompressed or expanded mode, flexible helical circuit board 24 is configured as a true helix with a space or gap 52, defined between each helical spiral 54 so that flexibility of flexible helical circuit board 24 is achieved. Preferably gaps 52 shown in FIG. 4 between each helical spiral 54 is equal to the width of the compressed helical circuit board 24A for maximum flexibility. The flexible lighting strip 10 can be laid out so that there is adequate omni-directional light coverage around the complete circumference of the elongated flexible tubular housing 12.

Figure 6:
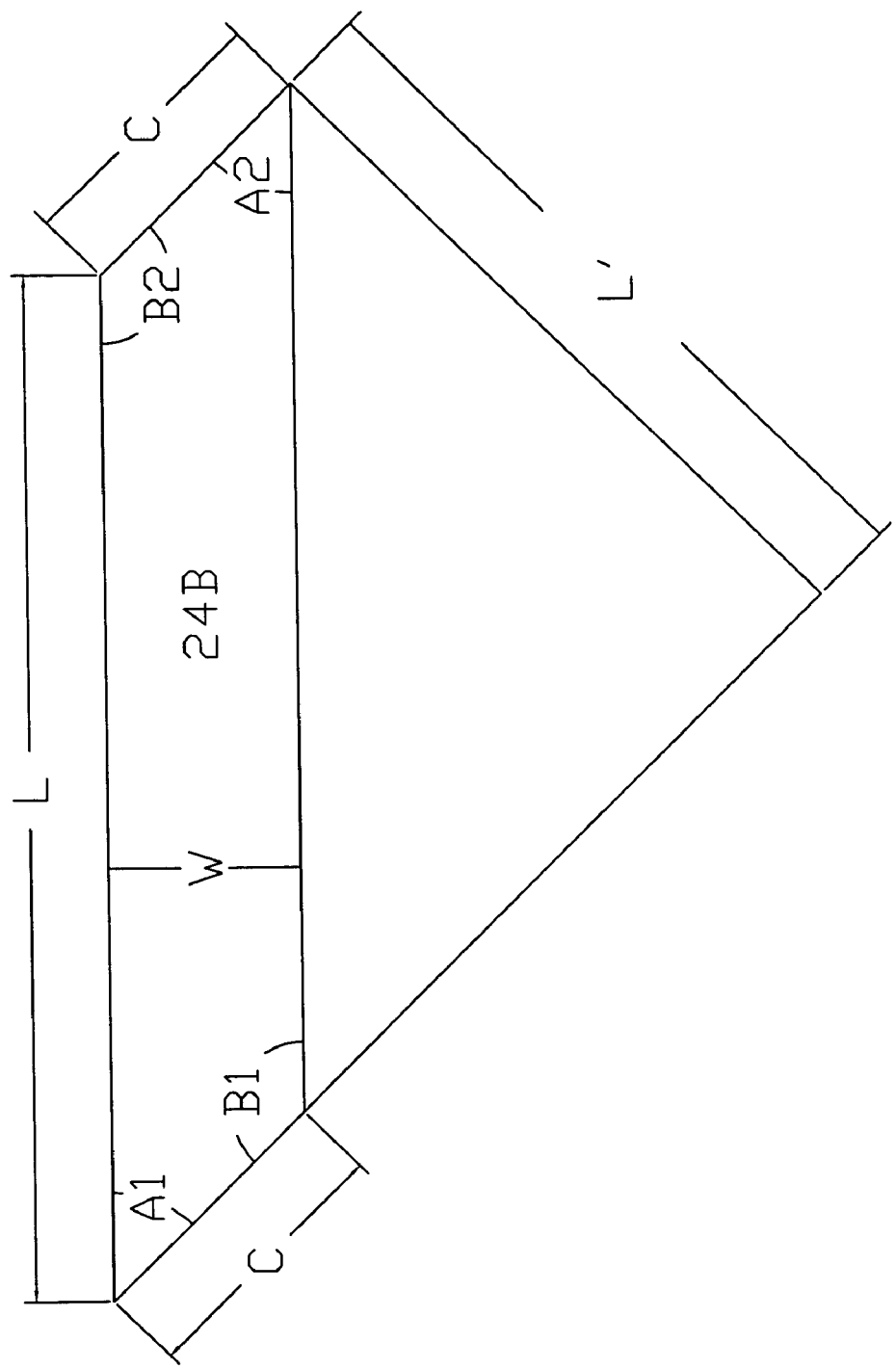
FIG. 6 is a flat view of a flexible circuit board prior to the mounting of LEDs, electrical circuitry and electrical components showing the outside surface of the circuit board and prior to it being formed into a compressed helical circuit board such as that shown in FIG. 3.

The method of constructing compressed helical circuit board 24A is illustrated in conjunction with FIG. 6, which shows a flat mode representation of a parallelogram-shaped flat mode circuit board 24B in preparation for the construction of flexible helical circuit board 24. Flat mode circuit board 24B is made of a flexible electrically non-conductive and high-temperature resistant plastic material such as, for example, polyimide. FIG. 6 shows flat mode circuit board 24B with the exterior surface 28 of flexible helical circuit board 24 facing upwards. The following designations and formulas refer to the flat mode representation of flat mode circuit board 24B of FIG. 6.

Short edges C of parallelogram-shaped flat mode circuit board 24B equals the circumference C of compressed helical circuit board 24A of FIG. 3=$d_1 \times$ pi (3.1415927).

From FIG. 3, long edges L of parallelogram flat mode equals length L' of compressed helical circuit board 24A divided by sine $A_1$=sine 45°=0.7071.

Flat mode circuit board 24B shown in FIG. 6 has an exterior surface 28 facing upwards and configured as a parallelogram in preparation for formation to a cylindrical compressed circuit board such as compressed helical circuit board 24A shown in FIG. 3.

Parallelogram-shaped flat mode circuit board 24B includes two long opposed parallel edges L and two short opposed parallel edges C that form opposed 45° angles $A_1$ and $A_2$ and opposed 135° angles $B_1$ and $B_2$. It can be appreciated by someone skilled in the arts to create a parallelogram-shaped flat mode circuit board with acute angles other than 45° and obtuse angles other than 135°. The number of helical spirals 54, such as, for example, the six helical spirals 54 as seen in FIG. 3, is determined by length L' divided by the circumference C.

The width W of the compressed helical circuit board 24A is equal to the circumference C multiplied by the sine of angle $A_1$ or $A_2$ or 45° in this example. Taking this into consideration, in order to compensate for the open helical spirals, the length L' of compressed helical circuit board 24A as shown in FIG. 3 and the starting diameter $d_1$ of compressed helical circuit board 24A should be doubled. For the preferred embodiment of the present invention of flexible lighting strip 10 as shown in FIGS. 1 and 2, Diameter $D_2$ of uncompressed flexible helical circuit board 24 is equal to the inside diameter $D_1$ of flexible tubular housing 12 shown in FIG. 1 minus twice the height of the LEDs 36 including LED lead 46 shown in FIG. 2.

Figure 7:
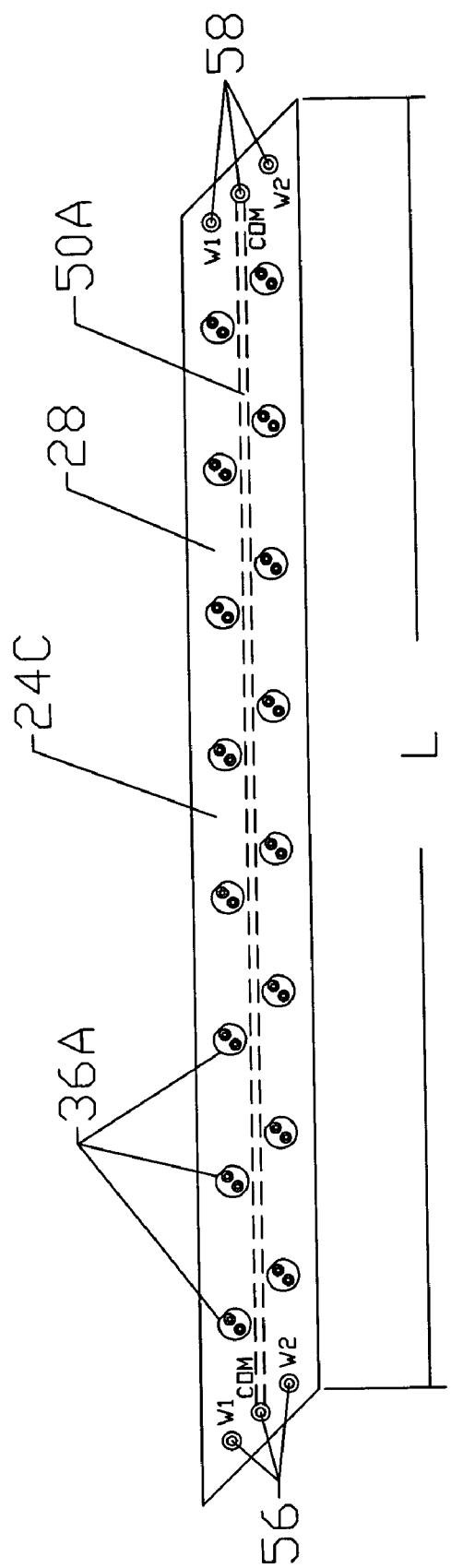
FIG. 7 shows a top view of a flexible circuit board in a flat mode prior to being formed into a compressed helical configuration such as seen in FIG. 3 with LEDs mounted and held thereon, and also showing a stiffening wire embedded therein.

A further example of flat mode circuit board 24B is shown in FIG. 7 as flat mode circuit board 24C where an example of 16 white LEDs 36A are shown located on both sides of stiffening wire 50A that extend substantially the entire length L between short sides C. A power input 56 and a power output 58 are mounted in flat mode circuit board 24C at opposed short ends C for white LEDs 36A. White LEDs 36A are mounted perpendicular to exterior surface 28.

Figure 8:
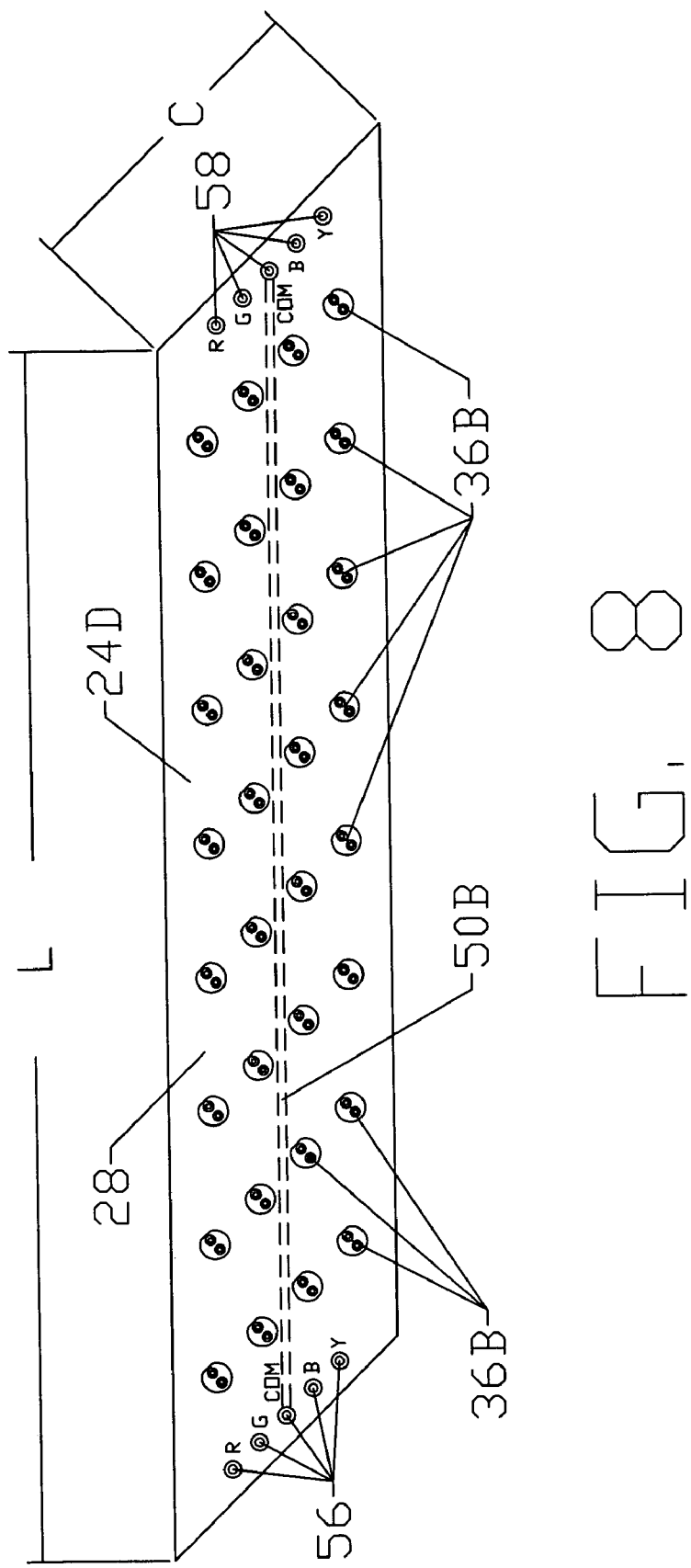
FIG. 8 shows a top view of a flexible circuit board in a flat mode prior to being formed into a compressed helical configuration such as seen in FIG. 3 with RGBY LEDs mounted and held thereon, and also showing a stiffening wire embedded therein.

Another example of flat mode circuit board 24B is shown in FIG. 8 as flat mode circuit board 24D where an example of 32 RGBY (color) LEDs 36B are shown located on both sides of a stiffening wire 50B that extends the length L between short sides C. A power input 56 and a power output 58 both known in the art are mounted in flat circuit board 24D at opposed short ends C for RGBY LEDs 36B. RGBY LEDs 36B are mounted perpendicular to exterior surface 28.

Figure 9:
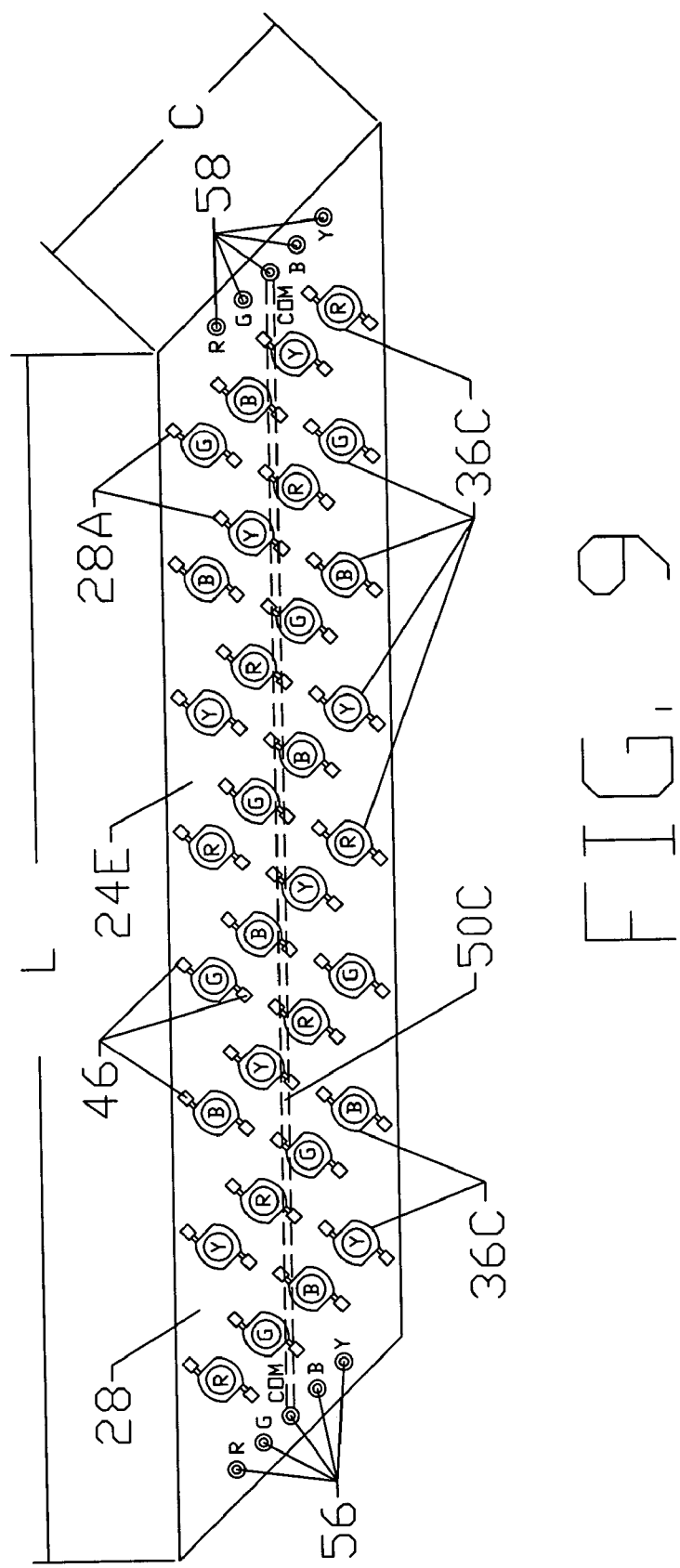
FIG. 9 shows a top view of a flexible circuit board in a flat mode prior to being formed into a compressed helical configuration such as seen in FIG. 3 with RGBY SMD LEDs mounted and held thereon, and also showing stiffening wire embedded therein.

Another example of flat mode flexible circuit board 24B is shown in FIG. 9 as flat mode circuit board 24E where an example of 32 RGBY (color) SMD LEDs 36C are shown located on both sides of a stiffening wire 50C that extends the length L between short sides C. A power input 56 and a power output 58 are mounted in flat circuit board 24E at opposed short ends C for RGBY SMD LEDs 36C. RGBY SMD LEDs 36C are mounted perpendicular to exterior surface 28. Surface mounted device or SMD LEDs are semiconductor devices that have leads that are soldered usually on the same side of the circuit board as the electrical components. SMD LEDs are smaller and have a greater beam spread than standard discrete axial LEDs.

LED leads 46 for RGBY SMD LEDs 36C as shown in FIG. 9 are mounted directly to helical circuit board 24 on exterior surface 28. SMD LED leads 46 and RGBY SMD LEDs 36C themselves are held in place with solder 28A.

Figure 10:
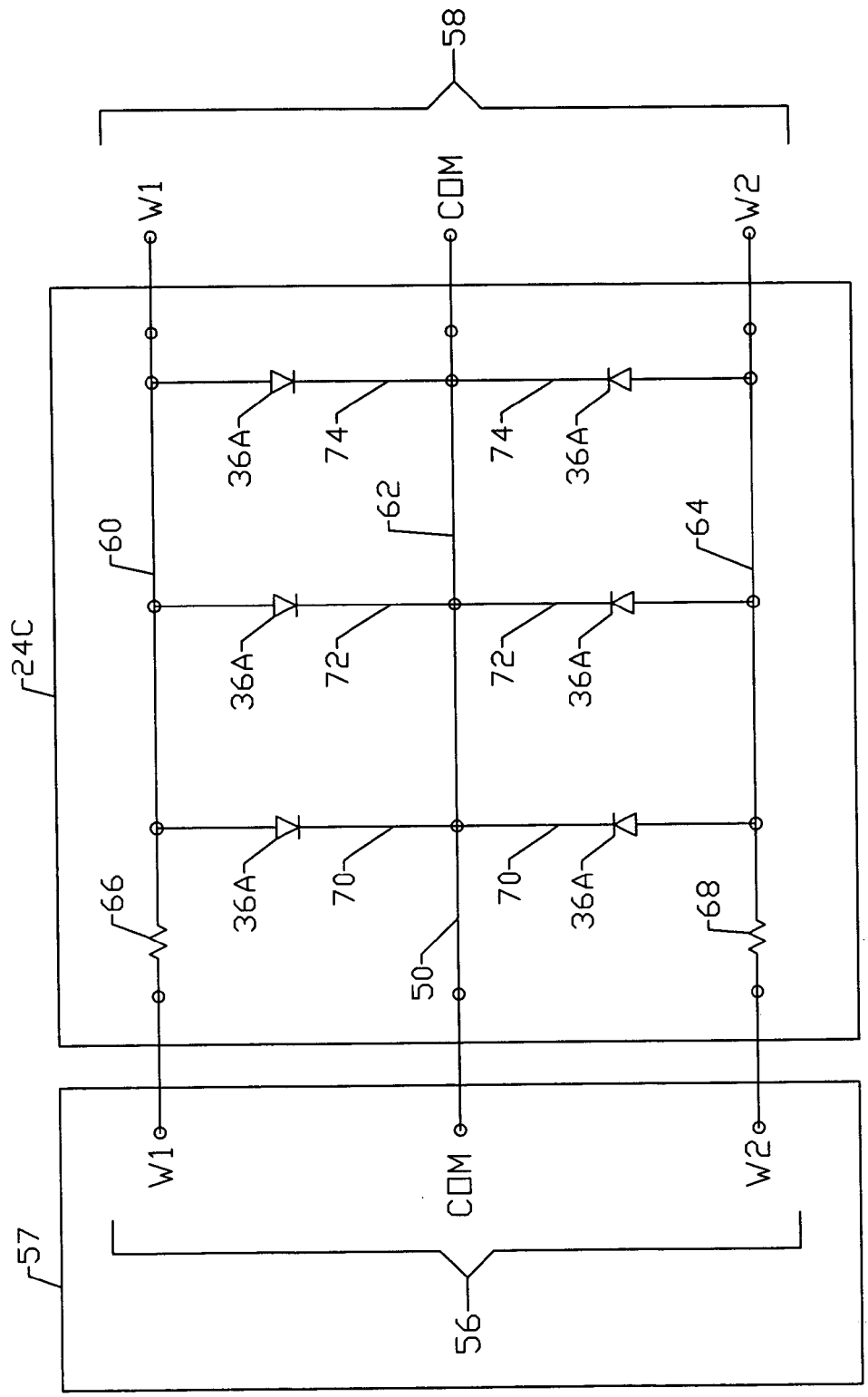
FIG. 10 is a schematic electrical circuit diagram showing the external power supply and controller for a chasing circuit for the LEDs shown in FIG. 7 for the most part mounted onto the flexible circuit board.

FIG. 10 is a schematic electrical circuit diagram showing the external power supply and controller 57 for a chasing circuit for the LEDs 36A shown in FIG. 7 for the most part mounted onto the flat mode circuit board 24C. An external LED power supply and controller 57 provides two separate control voltages W1 and W2 to drive LEDs 36A. A single white LED 36A is connected in a parallel configuration with other single white LEDs 36A. Because voltages W1 and W2 are independent of each other, they can be turned on and off individually and at full intensity to create an alternating chasing effect. Also, the external LED power supply and controller 57 can vary the voltages W1 and W2, thereby varying the current going into each white LED 36A. This in turn will cause all LEDs 36A connected to voltages W1 or W2 to dim and/or to fade. Schematically indicated flat circuit board 24C has mounted thereon a first wire lead 60, a common (COM) second lead wire 62, and a third lead wire 64 all of which extend between external power input 56 and external power output 58 known in the art. Common (COM) second lead wire 62 is positioned between first and third lead wires 60 and 64. First and third lead wires 60 and 64 have optional resistors 66 and 68, respectively, mounted thereto. Optional resistors 66 and 68 are provided to limit the current seen by each LED 36A connected in parallel. Parallel cross-lead wires 70, 72, and 74 are connected to first lead wire 60, common (COM) second lead wire 62, and third lead wire 64. Cross-lead wire 70 is positioned in parallel to second and third cross-lead wires 72 and 74. A first pair of white LEDs 36A is mounted to cross-lead 70 on either side of common (COM) second lead wire 62 with current passing to common (COM) second lead wire 62. A second pair of white LEDs 36A is mounted on cross-lead 72 in parallel connection with white LEDs 36A on cross-leads 70 and 74 on either side of common (COM) second lead wire 62 with current passing to common (COM) second lead wire 62. A third pair of white LEDs 36A is mounted on cross-lead 74 in parallel connection with white LEDs 36A on cross-leads 70 and 72 on either side of common (COM) second lead wire 62 with current passing to common (COM) second lead wire 62. Six white LEDs 36A are shown as examples of LEDs in parallel connection ready for chasing control, but many more white LEDs 36A can be mounted to flat mode circuit board 24C in accordance with the present invention.

Figure 11:
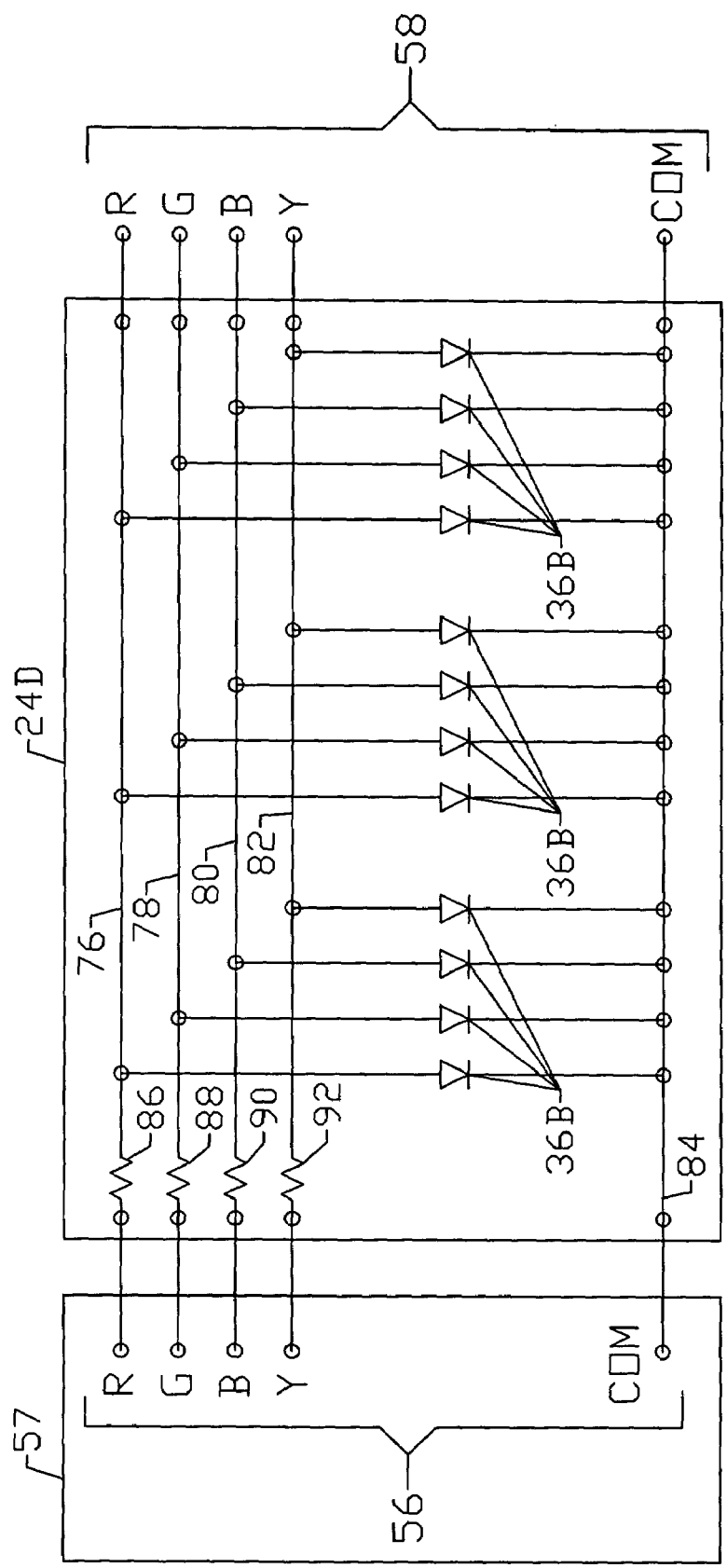
FIG. 11 is a schematic electrical circuit diagram showing the external power supply and controller for color mixing and color changing of the RGBY LEDs shown in FIG. 8 for the most part mounted onto the flexible circuit board.

FIG. 11 is a schematic electrical circuit diagram showing the external LED power supply and controller 57 for color mixing and color changing of the 32 RGBY LEDs 36B shown in FIG. 8 for the most part mounted onto flat circuit board 24D. For purposes of illustration, FIG. 11 shows 12 RGBY LEDs 36B, but it is to be understood that the same electrical schematic relationship would apply to the 32 RGBY LEDs 36B shown in FIG. 8. Schematically indicated flat circuit board 24D has mounted thereon a first R LED positive voltage lead wire 76, a second G LED positive voltage lead wire 78, a third B LED positive voltage lead wire 80, a fourth Y LED positive voltage lead wire 82, and a fifth common (COM) LED negative voltage lead wire 84, all of which extend in parallel relationship between external power input 56 and external power output 58. Optional resistors 86, 88, 90, and 92 are positioned on first R LED positive voltage lead wire 76, second G LED positive voltage lead wire 78, third B LED positive voltage lead wire 80, and fourth Y LED positive voltage lead wire 82, respectively. LED positive voltage lead wires 76, 78, 80, and 82 are in electrical connection with red, green, blue, and yellow or RGBY LEDs 36B, respectively, which are each connected to fifth common (COM) LED negative voltage lead wire 84. FIG. 11 shows first, second, and third sets of RGBY LEDs 36B all connected in this manner. It is to be understood that additional sets of RGBY LEDs can be added in the same manner as required.

Figure 12:
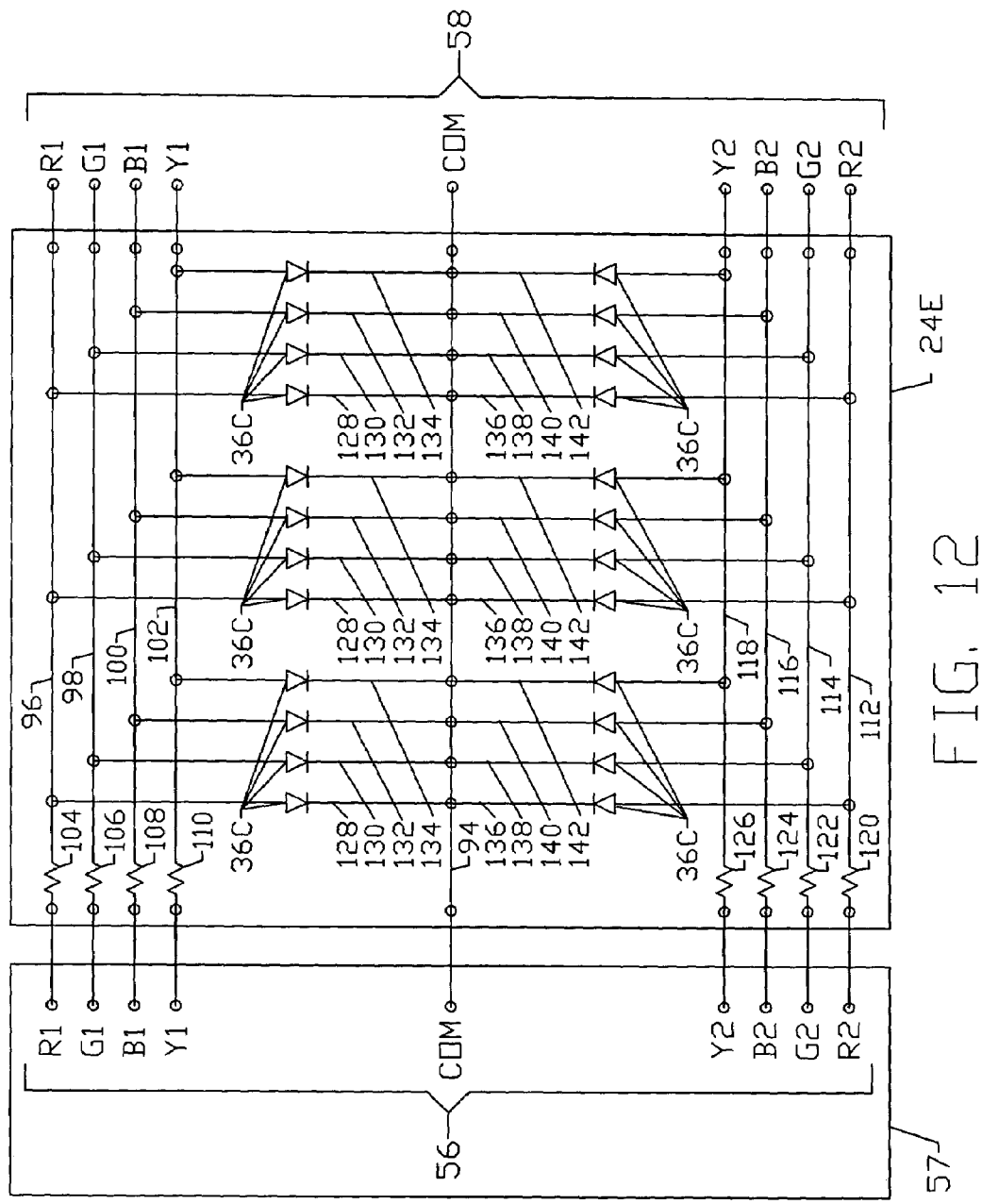
FIG. 12 is a schematic electrical circuit diagram showing the external power supply and controller for color mixing, color changing, and color chasing of the RGBY SMD LEDs shown in FIG. 9 for the most part mounted onto the flexible circuit board.

FIG. 12 is a schematic electrical circuit diagram showing the external LED power supply and controller 57 for color mixing, color changing, and color chasing control of the RGBY SMD LEDs 36C shown in FIG. 9 for the most part mounted onto circuit board 24E. For purposes of illustration, FIG. 12 shows 24 RGBY SMD LEDs 36C, but it is to be understood that the same electrical schematic relationship would apply to the 32 RGBY SMD LEDs 36C shown in FIG. 9. Schematically indicated flat circuit board 24E has mounted thereon a central common (COM) LED negative voltage lead wire 94 extending between external power input 56 and external power output 58. A first set of color control includes a R1 LED positive voltage lead wire 96, a G1 LED positive voltage lead wire 98, a B1 LED positive voltage lead wire 100, and a Y1 LED positive voltage lead wire 102 that extend between external power input 56 and external power output 58 each having an optional resistor 104, 106, 108, and 110, respectively. A second set of color control includes a R2 LED positive voltage lead wire 112, a G2 LED positive voltage lead wire 114, a B2 LED positive voltage lead wire 116, and a Y2 LED positive voltage lead wire 118 that extend between external power input 56 and external power output 58 each having an optional resistor 120, 122, 124, and 126, respectively. A first three groups of RGBY SMD LED leads each group comprising R1 LED negative voltage lead 128, G1 LED negative voltage lead 130, B1 LED negative voltage lead 132, and Y1 LED negative voltage lead 134 extend between central common (COM) LED negative voltage lead wire 94 and R1 LED positive voltage lead 96, G1 LED positive voltage lead 98, B1 LED positive voltage lead 100, and Y1 LED positive voltage lead 102, respectively. A second three groups of RGBY SMD LED leads each group comprising R2 LED negative voltage lead 136, G2 LED negative voltage lead 138, B2 LED negative voltage lead 140, and Y2 LED negative voltage lead 142 extend between central common (COM) LED negative voltage lead wire 94 and R2 LED positive voltage lead 112, G2 LED positive voltage lead 114, B2 LED positive voltage lead 116, and Y2 LED positive voltage lead 118, respectively. In each group, R1 LED negative voltage lead 128 and R2 LED negative voltage lead 136 are connected at common (COM) LED negative voltage lead 94; G1 LED negative voltage lead 130 and G2 LED negative voltage lead 138 are connected at common (COM) LED negative voltage lead 94; B1 LED negative voltage lead 132 and B2 LED negative voltage lead 140 are connected at common (COM) LED negative voltage lead 94; and Y1 LED negative voltage lead 134 and Y2 LED negative voltage lead 142 are connected at common (COM) LED negative voltage lead 94. Three double groups of RGBY SMD LEDs 36C are shown to illustrate the operation of the electrical system and additional groups of RGBY SMD LEDs 36C can be added in accordance with the present invention. External LED power supply and controller can turn on the eight R1G1B1Y1R2G2B2Y2 color LED positive voltages individually or collectively to achieve color mixing and color changing, and in an alternating pattern to create a color chasing effect.

It should be noted that someone skilled in the art can arrange and electrically connect the LEDs in FIGS. 10, 11, and 12 as described herein in reverse order such that the main positive voltage power coming from the external power supply and controller 57 to drive each LED are supplied through the common (COM) wire lead and the individual negative voltages are now connected to each white or color LED input voltage wire lead.

A flexible lighting strip 10 is shown in a fully assembled form with hardware connections in FIG. 13 and indicated as assembled flexible lighting strip 10A. The fully assembled flexible lighting strip 10A includes hardware connectors. Fully assembled lighting strip 10A includes flexible lighting strip 10 and connector end caps 20 and 22 mounted to opposed tubular ends 16 and 18. An indoor/outdoor male pin connector 144 is mounted to connector end cap 20 and an indoor/outdoor female socket connector 146 is mounted to connector end cap 22. Male pin connector 144 includes a removable dust cap cover 148 with a flexible cap holder 150 connected to male pin connector 144 for covering male pin connector end 152 is shown in FIG. 13A. Female socket connector 146 includes a removable dust cap cover 154 with a flexible cap holder 156 connected to female socket connector 146 for covering female socket connector end 158 is shown in FIG. 13B.

Fully assembled flexible lighting strip 10A as shown in FIG. 13 includes flexible lighting strip 10 including transparent tubular housing 12 with tubular shell 14, helical circuit board 24 mounted within tubular housing 12 to which are mounted a number of LEDs 36. For example, a complete system of 100 feet of assembled flexible lighting strip 10A can be made in units of 25 feet that is connected as follows: External LED power supply and controller 57 with a pigtail ending in a 5-pin (9-pin for a chasing circuit) female socket connector 146 is attached to the power input 5-pin (9-pin for a chasing circuit) male pin connector 144 of the first 25 feet of flexible lighting strip 10A. This method of connection continues until all four 25 foot lengths of flexible lighting strips 10A are all connected to form one complete 100 feet of flexible lighting strip 10A. When a female socket connector 146 is connected to a male pin connector 144, connector dust cap covers 148 and 154 are not used. Only the last connector in the fully assembled flexible lighting strip 10A has the integral connector dust cap cover 154 snapped over the last female socket connector 146. This completes the 100-foot assembly. It is noted that a special two-fer or Y-splitter cable can be used that basically splits the LED power supply and controller signal from external LED power supply and controller 57 into two lines for additional versatility.

Figure 14:
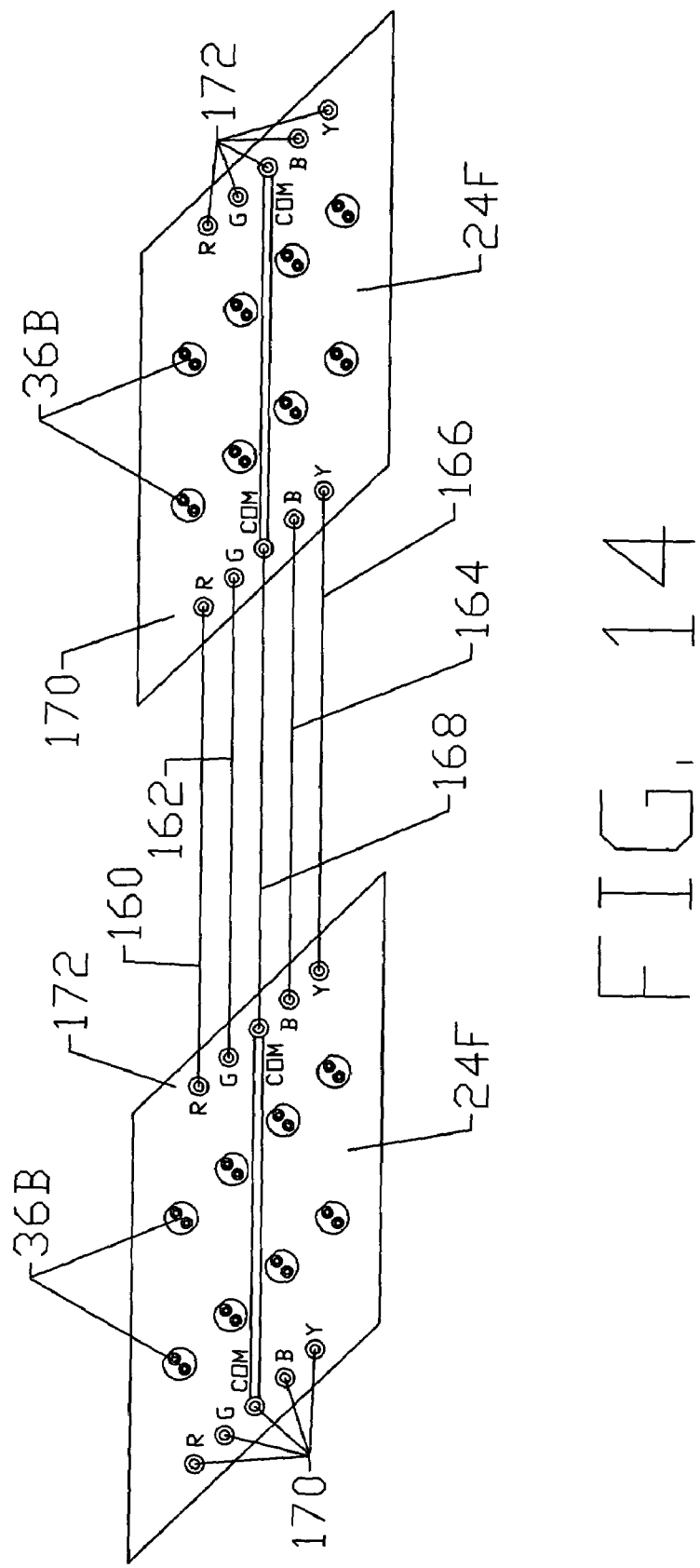
FIG. 14 shows two flexible parallelogram-shaped flat circuit boards spaced apart in a flat mode in a spaced electrically connected relationship with electrical wiring between them prior to being formed into a helical configuration for insertion into a tubular housing such as shown seen in FIG. 1.

FIG. 14 shows two flexible parallelogram shaped flat circuit boards 24F spaced apart in a flat mode in a spaced cascading connection relationship with electrical wiring between them. Six RGBY LEDs 36B are mounted to each flat circuit board 24F. R LED positive voltage lead 160, G LED positive voltage lead 162, B LED positive voltage lead 164, and Y LED positive voltage lead 166 extend between power input 168 of one flat circuit board 24F and power output 170 of the other circuit board 24F. A central common LED negative voltage lead 167 extends between power input 168 and power output 170. Both circuit boards 24F are subsequently formed as compressed helical circuit boards analogous to compressed helical circuit board 24A shown in FIG. 3, and then inserted into a tubular housing such as tubular housing 12 shown in FIG. 1.

Figure 15:
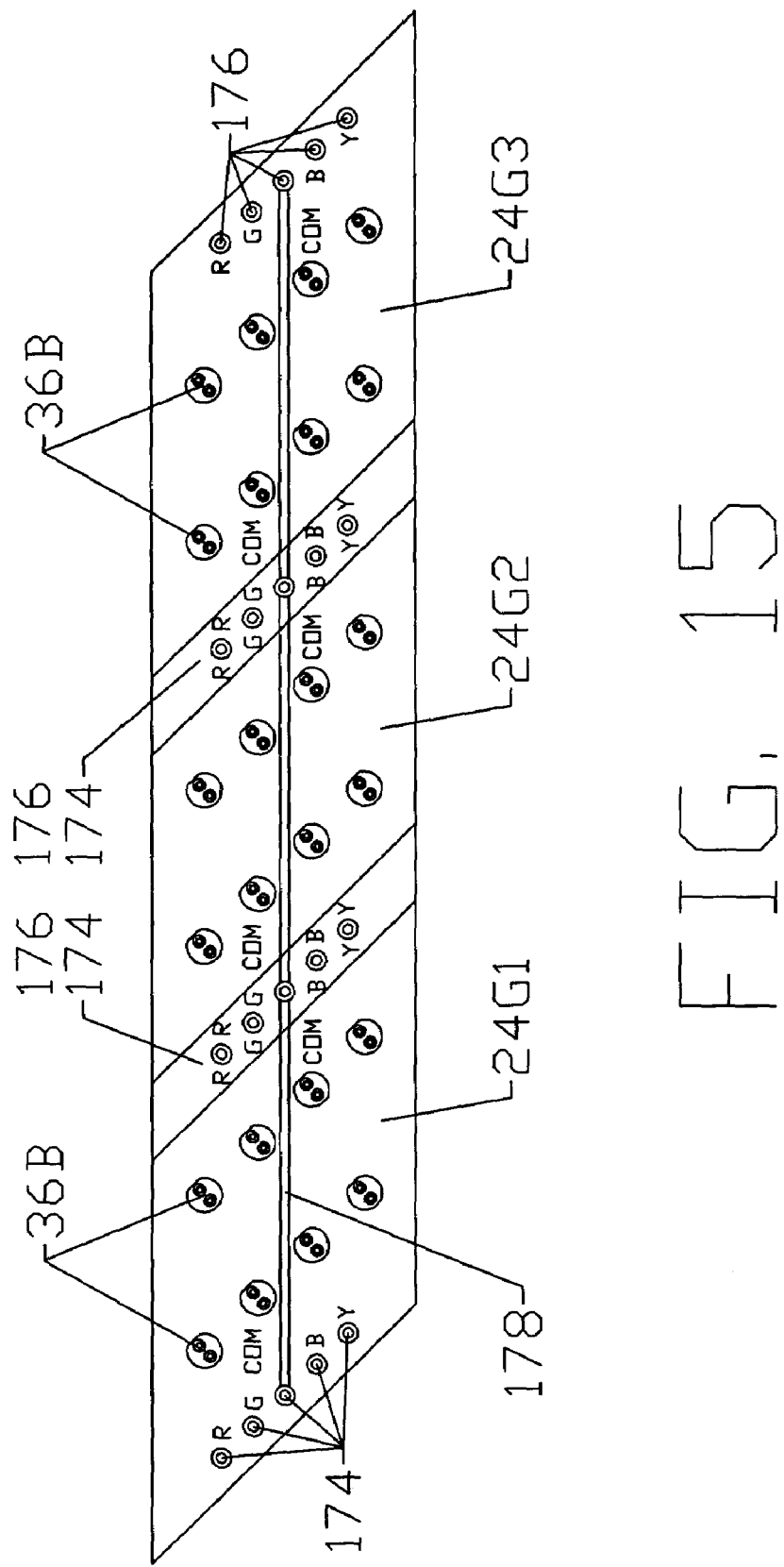
FIG. 15 shows three flexible parallelogram-shaped flat circuit boards in an overlapping cascading relationship in a flat mode prior to being formed into a helical configuration for subsequent insertion into a tubular housing such as shown in FIG. 1.

FIG. 15 shows three flexible parallelogram flat circuit boards 24G1, 24G2, and 24G3 are connected in an overlapping cascading relationship. Six RGBY LEDs 36B are mounted to each flat circuit board 24G1 to 24G3. Power output 172 of flat circuit board 24G1 is directly connected to power input 174 of flat circuit board 24G2. Power output 176 of flat circuit board 24G2 is directly connected to power input 178 of flat circuit board 24G3. A central output lead 175 extends through flat circuit boards 24G1, 24G2 and 24G3 between power inputs 174 and power outputs 176. Circuit boards 24G1, 24G2, and 24G3 are subsequently formed as compressed helical circuit boards analogous to compressed helical circuit board 24A shown in FIG. 3 and then inserted into a tubular housing such as tubular housing 12 shown in FIG. 1.

Figures 16, 16A:
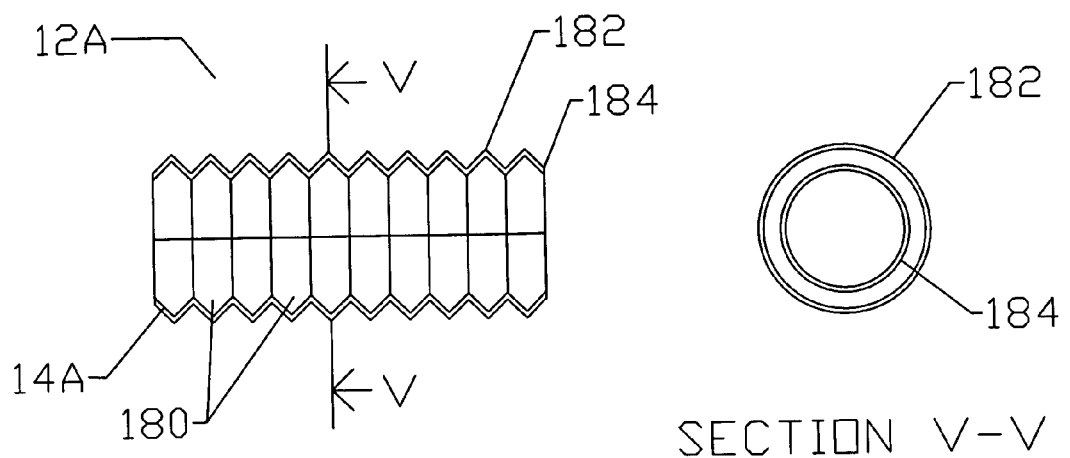
FIG. 16 is an alternate tubular housing with a triangular ribbed outer surface.
FIG. 16A is a view taken through line V—V in FIG. 16.

FIG. 16 shows an alternate tubular housing 12A analogous to tubular housing 12 with a series of triangular ribs 180 defining outer tubular shell 14A. In FIG. 16A, the tops of ribs 182 and the bottoms of ribs 184 are seen.

Figures 17, 17A:
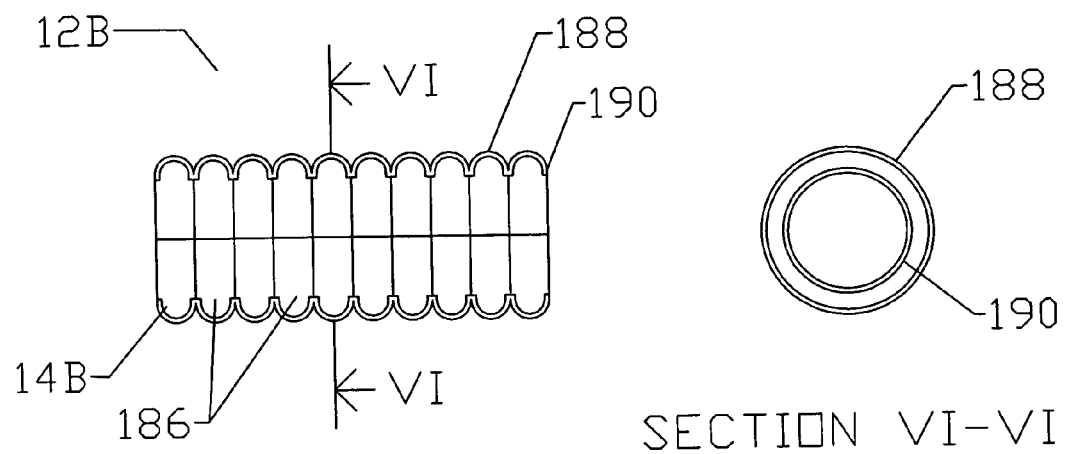
FIG. 17 is an alternate tubular housing with a hemispherical ribbed outer surface.
FIG. 17A is a view taken through line VI—VI in FIG. 17.

FIG. 17 shows an alternate tubular housing 12B analogous to tubular housing 12 with a series of hemispheres 186 defining outer tubular shell 14B. In FIG. 17A, the tops of hemispheres 188 and the bottoms of hemispheres 190 are seen.

Figure 18A:
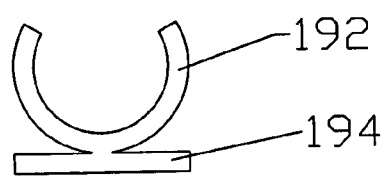
FIG. 18A is an end view of a hemispherical grip for the flexible lighting strip shown in FIG. 1 with a flat holding base.

FIG. 18A is an end view of a hemispherical grip 192 for a flexible lighting strip 10 having a tubular housing 12 shown in FIGS. 1, 16, or 17 with a flat holding base 194.

Figure 18B:
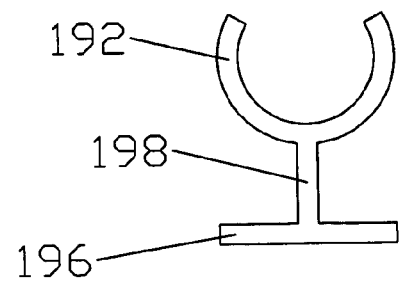
FIG. 18B is an end view of a hemispherical grip for the flexible lighting strip shown in FIG. 1 with a flat holding base connected to the hemispherical grip by a joining member.

FIG. 18B is an end view of a hemispherical grip 192 for a flexible lighting strip 10 having a tubular housing 12 shown in FIGS. 1, 16, or 17 with flat holding base 196 connected to hemispherical grip 192 by an elongated joining member 198.

Figure 18C:
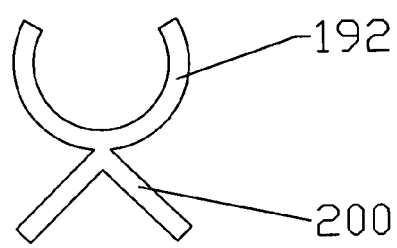
FIG. 18C is an end view of a hemispherical grip for the flexible lighting strip shown in FIG. 1 connected to an outside corner right-angle shaped holding base.

FIG. 18C is an end view of a hemispherical grip 192 for a flexible lighting strip 10 having a tubular housing 12 shown in FIGS. 1, 16, or 17 connected to an outside corner right-angle shaped holding base 200.

Figure 18D:
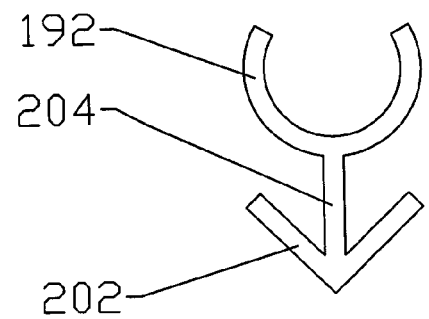
FIG. 18D is an end view of a hemispherical grip for the flexible lighting strip shown in FIG. 1 connected to an inside corner right-angle shaped holding base.

FIG. 18D is an end view of a hemispherical grip 192 for a flexible lighting strip 10 having a tubular housing 12 shown in FIGS. 1, 16, or 17 connected to an inside corner right-angle shaped holding base 202 connected to hemispherical grip 192 by an elongated joining member 204.

Figure 18E:
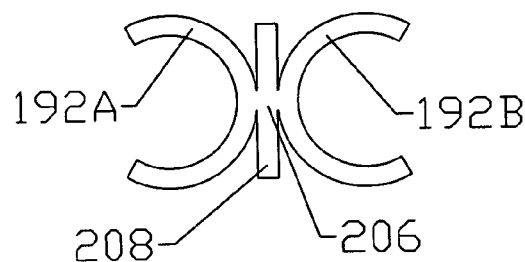
FIG. 18E is an end view of a double-sided hemispherical grip for the flexible lighting strip shown in FIG. 1 each connected to a joining member positioned between them.

FIG. 18E is an end view of double-sided hemispherical grips 192A and 192B for joining two flexible lighting strips 10 each having a tubular housing 12 shown in FIGS. 1, 16, or 17 joined at the base area 206 by a joining member 208.

Figure 18F:
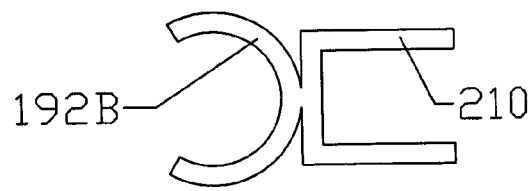
FIG. 18F is an end view of a hemispherical grip for the flexible lighting strip shown in FIG. 1 connected to a U-shaped holding base.

FIG. 18F is an end view of a hemispherical grip 192 for a flexible lighting strip 10 having a tubular housing 12 shown in FIGS. 1, 16, or 17 connected to a U-shaped holding base 210.

An alternate flexible lighting strip 212 is shown in FIG. 19. Flexible lighting strip 212 is shown foreshortened into a lighting strip of what is generally a more extended flexible lighting strip. Flexible lighting strip 212 is shown in a linear configuration for purposes of exposition although in use flexible lighting strip 212 is generally configured in any of a number of curved configurations.

The alternate tubular housings as shown in FIGS. 16, 16A, 17, and 17A and the various mounting hardware shown in FIGS. 18A–18F can be used with flexible lighting strip 212 as shown in FIG. 19.

Flexible lighting strip 212 includes an elongated flexible tubular housing 214 having a smooth translucent shell, or in particular a transparent tubular shell 216 as shown, and opposed tube ends 218 and 220 having connector end caps 222 and 224 respectively, secured thereto and a cylindrical flexible circuit board 226 positioned in tubular housing 214 and in particular tubular shell 216. Flexible circuit board 226 is configured as a cylinder having opposed continuous interior and exterior surfaces 228 and 230 respectively, and circuit board opposed ends 232 and 234 positioned at opposed tube ends 218 and 220, respectively. Flexible circuit board 226 and tubular housing 214 are both cylindrical and circular in cross-section and have a coextensive axis 236. A number of LEDs 238 are mounted on flexible circuit board 226 at spaced intervals.

Figure 20:
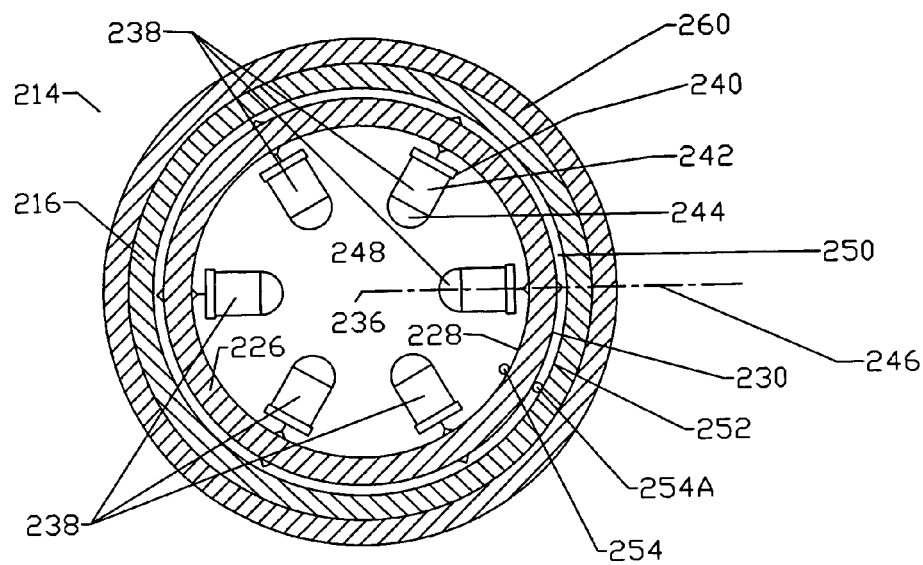
FIG. 20 is an end view of the tubular housing taken through line IX—IX of the flexible lighting strip shown in FIG. 19 further showing the inwardly directed LEDs mounted on the circuit board.

FIG. 20 shows a view taken through flexible lighting strip 212 at tube end 218 perpendicular to coextensive axis 236. Each LED 238 includes a base portion 240, a body portion 242, and a lens portion 244. Each LED 238 has an LED centerline 246 that is perpendicular to coextensive axis 236. Lens portions 244 are positioned in the cylindrical hollow 248 defined by cylindrical flexible circuit board 226 and in particular by interior surface 228 of circuit board 226. LED base portions 240 are secured to flexible circuit board 226 by any suitable means known in the art. There is an elongated ring-shaped space 250 defined between the interior side 252 of tubular shell 216 and exterior surface 230 of flexible circuit board 226. LEDs 238 are electrically connected to electrical conductors mounted to flexible circuit board 226, which can be optionally mounted to either interior surface 228 or exterior surface 230 of flexible circuit board 226. Electrical circuitry include traces, solder pads, plated through holes and vias, and related electronic components in connection with LEDs 238 which can optionally be mounted to either interior surface 228 or exterior surface 230. LEDs 238 are so positioned and aligned that LEDs 238 shown in FIG. 19 are a result of regular overlapping alignment of the total of LEDs 238 located on flexible circuit board 226 when flexible circuit board 226 is configured in a linear alignment as shown in FIG. 19, although in use flexible LED lighting strip 212 would often have a curved configuration.

Flexible circuit board 226 is preferably made of a polyimide plastic material that can withstand the high temperatures that can occur during the process of soldering LED leads thereto. A thickness of approximately a minimum of 0.01 inches of polyimide material will allow the flexibility that is integral with flexible lighting strip 212, and in addition will offer the rigidity required to maintain the shape of flexible circuit board 226.

Figure 20A:
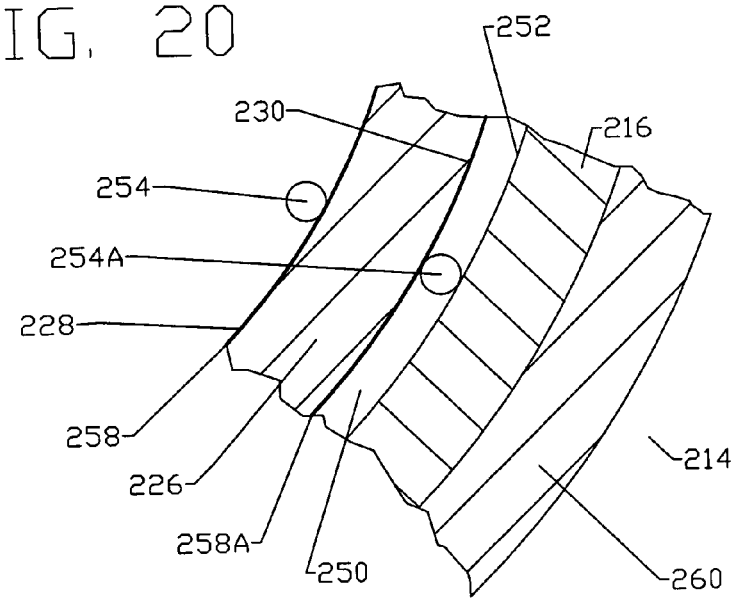
FIG. 20A is an enlarged detailed view of a section of FIG. 20.
Figure 21:
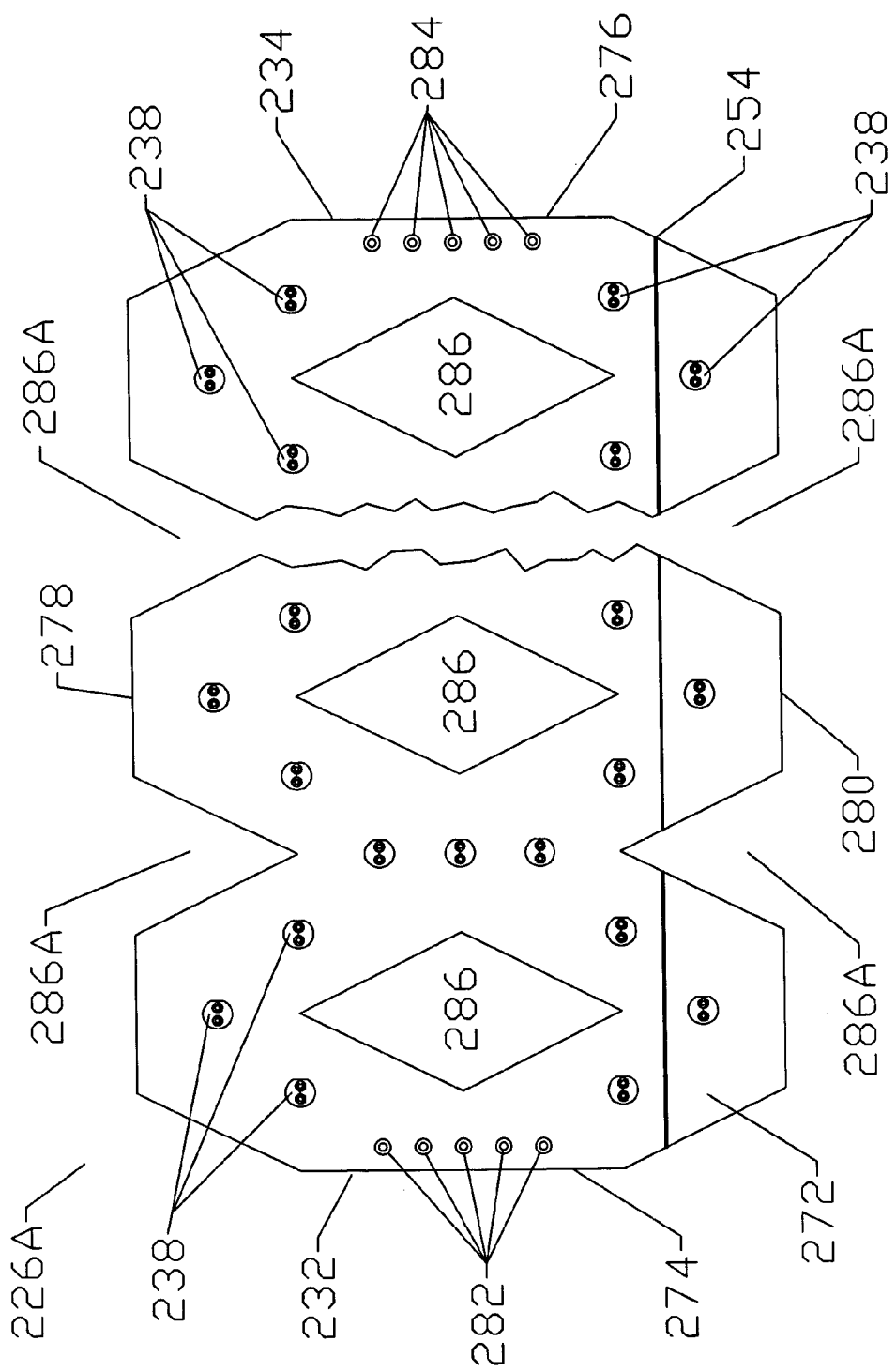
FIG. 21 is a top view of a representative segment of the flexible circuit board shown in FIGS. 19 and 20 shown in a flat mode prior to being formed into a cylindrical configuration with LEDs mounted upright and held thereon prior to being rolled into a circular configuration with the topside of the segment of the flat flexible circuit board being the interior surface of the rolled circuit board prior to being inserted into the tubular housing as shown in FIGS. 19 and 20.

A stiffening member particularly shown as stiffening wire 254 secured to the entire length of flexible circuit board 226 between circuit board ends 232 and 234 is shown in cross-section in FIGS. 20 and 20A. A stiffening wire 254A can optionally be secured to tubular shell 216. Stiffening wire 254A can be the only stiffening wire or can be mounted in conjunction with stiffening wire 254 on flexible circuit board 226. Stiffening wire 254 is also shown in FIGS. 20, 20A, and 21. Stiffening wires 254 and 254A add strength to lighting strip 212 and further provides the rigidity to maintain the entire flexible lighting strip 212 in the shape it is placed, for example, in a curved or looped mode, during the time of its use. Stiffening wires 254 and 254A are preferably made of metal for strength and rigidity, and as such can be electrically connected to the common or the negative DC voltage lead of each LED 238. Also, when stiffening wires 254 and 245A are made of an electrically conductive metal, they can act as a heat sink to draw the heat generated by the LEDs 238. Such electrically conductive metal can be, for example, substantially aluminum or copper. Stiffening wires 254 and 254A are secured to flexible circuit board 226 and tubular shell 216 respectively, by any suitable means known in the art including gluing, soldering, or other securing means.

FIG. 19 further shows a plurality of cutouts 256 as defined by circuit board 226 between interior and exterior surfaces 228 and 230. Cutouts 256 are located at regular intervals between circuit board ends 232 and 234. Cutouts 256 are of sufficient size and of advantageous dimensions to pass light from the LEDs 238 from cylindrical hollow 248 to the exterior of lighting strip 212 and allow for the bending of flexible circuit board 226. The configuration of cutouts 256, which are conformed in curved cylindrical alignment with circuit board 226, are such that cutouts 256 have two pairs of opposed acute angles. Cutouts 256 are of sufficient size and quantity to pass light from LEDs 238 from cylindrical hollow 248 yet are of such dimensions that the integrity of the strength of circuit board 226 is maintained. Other advantageous configurations and number of cutouts 256 can be used.

As can be seen from FIG. 20A, a reflective coating 258 is applied to interior surface 228 of flexible circuit board 226. A reflective coating 258A can also be applied to exterior surface 230. Reflective coatings 258 and 258A serve to aid in the reflection of light from LEDs 238 through cutouts 256 to the exterior of lighting strip 212.

Fully assembled LED flexible lighting strip 212 includes hardware connectors as described as follows with references to FIGS. 19A and 19B. Connector end caps 222 and 224 as previously described are mounted to opposed tubular ends 218 and 220. An indoor/outdoor male pin connector 260 is mounted to connector end cap 222 and an indoor/outdoor female socket connector 262 is mounted to connector end cap 224. A removable dust cap cover 264 with a flexible cap holder 266 is connected to male pin connector 260 as shown in FIG. 19A. A removable dust cap cover 268 with a flexible cap holder 270 is connected to female socket connector 262 as shown in FIG. 19B.

The electrical circuitry mounted on flexible circuit board 226 and LEDs 238 electrically connected thereto are in accordance with and analogous to the electrical wiring diagrams shown in FIGS. 10, 11, and 12 described earlier in relation to flexible helical circuit board 24 of flexible lighting strip 10.

FIG. 21 is a broken segment of elongated flat mode circuit board 226A of the entire cylindrical flexible circuit board 226 prior to the assembled mode. In particular, flat mode circuit board 226A is shown prior to being made cylindrical and inserted, or pulled into tubular housing 214 in the manufacturing process, or assembly of flexible lighting strip 212 with the flat topside 272 shown. Flat mode circuit board 226A includes opposed linear short edges 274 and 276 and opposed linear long edges 278 and 280. LEDs 238 are shown in an upright position with LEDs base portions 240 connected to the topside 272 of flat mode circuit board 226A with lens portions 244 extending upwardly. Five power inputs 282 are shown mounted at linear short edge 274. Power inputs 282 are analogous to power inputs 56 shown in FIGS. 10, 11, and 12 of flexible lighting strip 10. Power inputs 282 are connected to an external LED power supply and controller (not shown). Five power outputs 284 are likewise mounted at opposed linear short edge 276 of flat mode circuit board 226A. Power outputs 284 are analogous to power outputs 58 shown in FIGS. 10, 11, and 12.

The electrical power for flexible LED lighting strip 212 is analogous to that shown in FIG. 10 for flexible lighting strip 10 which is a schematic electrical circuit diagram showing the external power supply and controller 57 for a chasing circuit for the LEDs 36A shown in FIG. 7 for the most part mounted onto the flat mode circuit board 24C. External LED power supply and controller 57 provides two separate control voltages W1 and W2 to drive LEDs 36A. A single white LED 36A is connected in a parallel configuration with other single white LED 36A. Because voltages W1 and W2 are independent of each other, they can be turned on and off individually and at full intensity to create an alternating chasing effect. Also, the external LED power supply and controller 57 can vary the voltages W1 and W2, thereby varying the current going into each white LED 36A. This in turn will cause all LEDs 36A connected to voltages W1 or W2 to dim and/or to fade.

LEDs 238 can optionally be white light LEDs or color LEDs that is, RGBY LEDs. In the latter case an analogous schematic electrical circuit diagram can be applied for RGBY LEDs such as shown in FIGS. 11 and 12. It is to be understood that the same electrical schematic relationship as shown for the RGBY SMD LEDs 36C shown in FIG. 9 that refers to flexible LED lighting strip 10 also apply to LEDs 238 of flexible lighting strip 212. Power inputs 282 and power outputs 284 indicated on FIG. 21 have reference to the power inputs and outputs as described herein in reference to FIGS. 11 and 12.

A method for making flexible LED lighting strip 212 includes the following steps:

1. Providing a biasable flat circuit board represented as flat mode circuit board 226A having a flat topside 272 and opposed linear short edges 274 and 276 and opposed linear long edges 278 and 280, the flat mode circuit board 226A further including a stiffening member such as stiffening wire 254 secured to topside 272 with flat mode circuit board 226A located between long edges 278 and 280 and extending between short edges 274 and 276. Flat mode circuit board 226A defines a plurality of diamond shaped cutouts 286 located at regular intervals between short edges 274 and 276, and further defining a plurality of semi-diamond shaped cutouts 286A opening at long edges 278 and 280 that are directly opposed one to the other generally midway between diamond shaped cutouts 286 relative to long edges 278 and 280 of flat mode circuit board 226A;

2. Mounting electrical circuitry including traces, solder pads, plated through holes and vias, and related electronic components in preparation for a plurality of LEDs 238 to be mounted to the flat mode circuit board 226A;

3. Securing the plurality of LEDs 238 in a manner known in the art to the flat mode circuit board 226A between long edges 278 and 280 and extending generally between the short edges 274 and 276, the LEDs 238 having LED centerlines 246 perpendicular to the flat mode circuit board 226A;

4. Connecting the LEDs 238 to the electrical circuitry;

5. Providing a translucent flexible hollow tubular housing 214 having a tubular housing length and a tubular housing inner diameter;

6. Forming the biasable flat mode circuit board 226A into a biased mode tightly rolled flexible circuit board 226 having a rolled cylindrical circuit board length that is generally equal to the tubular housing length with the flat topside 272 as shown in FIG. 21 being the interior surface 228 of the rolled flexible circuit board 226 and the flat bottom side opposed to flat top side 272 becoming the exterior surface 230 of the assembled cylindrical flexible circuit board 226, the LEDs 238 being inwardly directed to the coextensive axis 236 of the hollow tubular housing 214, the operative outer diameter of the tightly rolled and cylindrical flexible circuit board 226 being less than the inner diameter of the tubular housing 214;

7. Pulling the tightly rolled and cylindrical flexible circuit board 226 into the tubular housing 214 and aligning the length of the rolled flexible circuit board 226 with the length of the tubular housing 214 and releasing the rolled flexible circuit board 226 from its biased mode wherein the rolled flexible circuit board 226 now becomes the partly rolled and cylindrical flexible circuit board 226 shown in FIGS. 19 and 20, and wherein the base portions 240 of the inwardly directed LEDs 238 are adjacent to and in biased contact with the interior surface 228 of the assembled flexible circuit board 226 and the centerlines of the inwardly directed LEDs 238 are perpendicular to the coextensive axis 236;

8. Securing power input and power output terminals to the electrical circuitry of the assembled flexible circuit board 226 and the LEDs 238;

9. Securing opposed end caps 222 and 224 to the opposed ends 218 and 220 of the tubular housing 214;

10. Mounting a male pin connector 260 to end cap 222;

11. Mounting a female socket connector 262 to end cap 224; and

12. Mounting an optional removable cap cover 264 to male pin connector 260 and an optional removable cap cover 268 to the female socket connector 262.

Another flexible lighting strip 288 is shown in FIG. 22. Flexible lighting strip 288 is shown foreshortened into a lighting strip of what is generally a more extended flexible lighting strip known in the art. Flexible lighting strip 288 is shown in a linear configuration for purposes of exposition although in use flexible lighting strip 288 is generally configured in any of a number of curved configurations.

The alternate tubular housings as shown in FIGS. 16, 16A, 17, and 17A and the various mounting hardware shown in FIGS. 18A–18F can be used with flexible lighting strip 288 as shown in FIG. 22.

Flexible lighting strip 288 includes an elongated flexible tubular housing 290 having a smooth translucent shell, such as the transparent tubular shell 292 as shown, and opposed tube ends 294 and 296 having connector end caps 298 and 300 respectively, secured thereto and a cylindrical flexible circuit board 302 positioned in tubular housing 290 and in particular tubular shell 292. Flexible circuit board 302 is configured as a cylinder having opposed continuous interior and exterior surfaces 304 and 306 respectively, and circuit board opposed ends 308 and 310 positioned at tube opposed ends 294 and 296, respectively. Flexible circuit board 302 and tubular housing 290 are both cylindrical and circular in cross-section and have a coextensive axis 312. A number of LEDs 314 are mounted on flexible circuit board 302 at spaced intervals.

Figure 23:
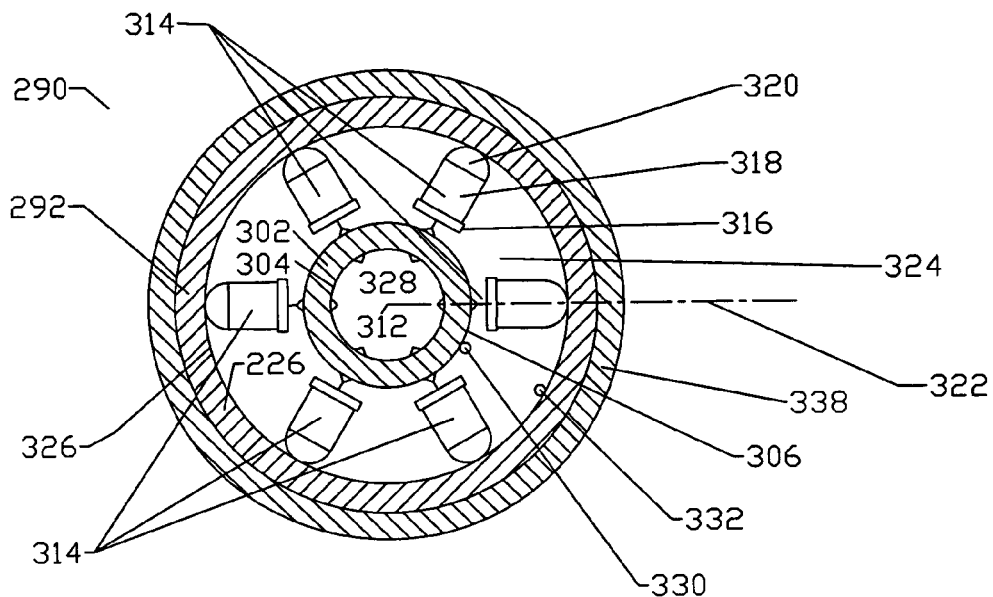
FIG. 23 is an end view of the tubular housing taken through line XII—XII of the flexible lighting strip shown in FIG. 22 together with the flexible circuit board mounted therein and further showing the outwardly directed LEDs mounted on the circuit board.

FIG. 23 shows a view taken through flexible lighting strip 288 at tube end 294 perpendicular to coextensive axis 312. Each LED 314 includes a base portion 316, a body portion 318, and a lens portion 320. Each LED 314 has an LED centerline 322 that is perpendicular to coextensive axis 312.

LEDs 314 are positioned in an elongated ring-shaped space 324 defined by exterior surface 306 of cylindrical flexible circuit board 302 and the interior side 326 of cylindrical tubular shell 292. LED base portions 316 are secured to flexible circuit board 302 by suitable means known in the art. LEDs 314 are electrically connected to electrical conductors mounted to flexible circuit board 302, which can be optionally mounted to either interior surface 304 or exterior surface 306 of flexible circuit board 302. Electrical circuitry include traces, solder pads, plated through holes and vias, and related electronic components in connection with LEDs 314 which can optionally be mounted to either interior surface 304 or exterior surface 306. LEDs 314 are so positioned and aligned that LEDs 314 shown in FIG. 22 are a result of regular overlapping alignment of the total of LEDs 314 located on flexible circuit board 302 when flexible circuit board 302 is configured in a linear alignment as shown in FIG. 22, although in use flexible LED lighting strip 288 would generally have any of a number of curved configurations.

Flexible circuit board 302 is preferably made of a polyimide plastic material that can withstand the high temperatures that can occur during the process of soldering LED leads thereto. A thickness of approximately a minimum of 0.01 inches of polyimide material will allow the flexibility that is integral with flexible lighting strip 288, and in addition will offer the rigidity required to maintain the shape of flexible circuit board 302.

Figure 23A:
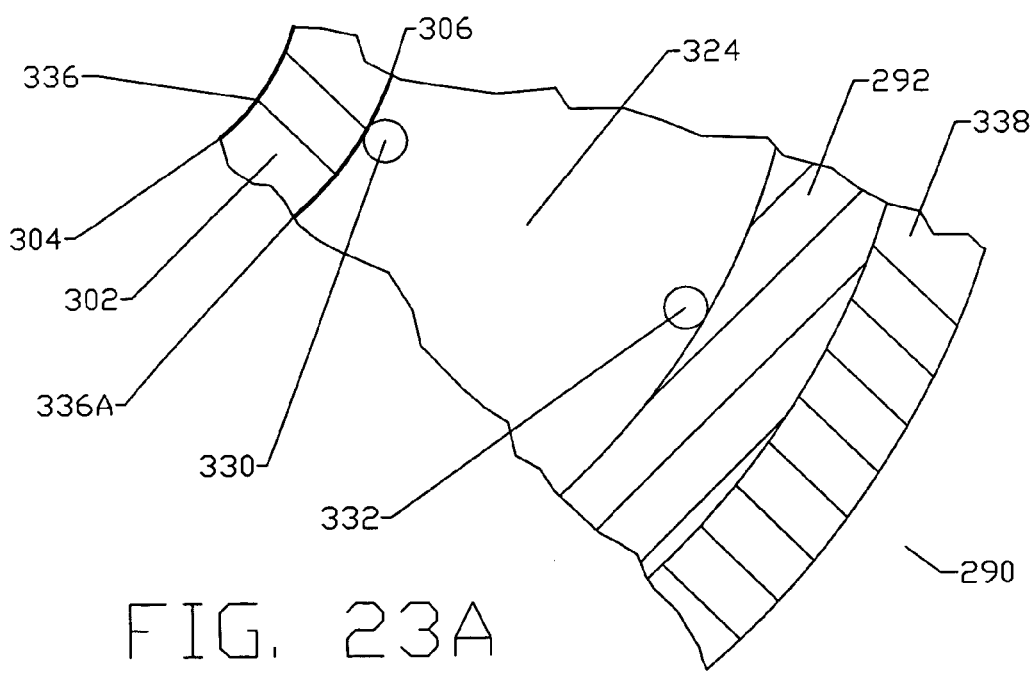
FIG. 23A is an enlarged detailed view of a section of FIG. 23.
Figure 24:
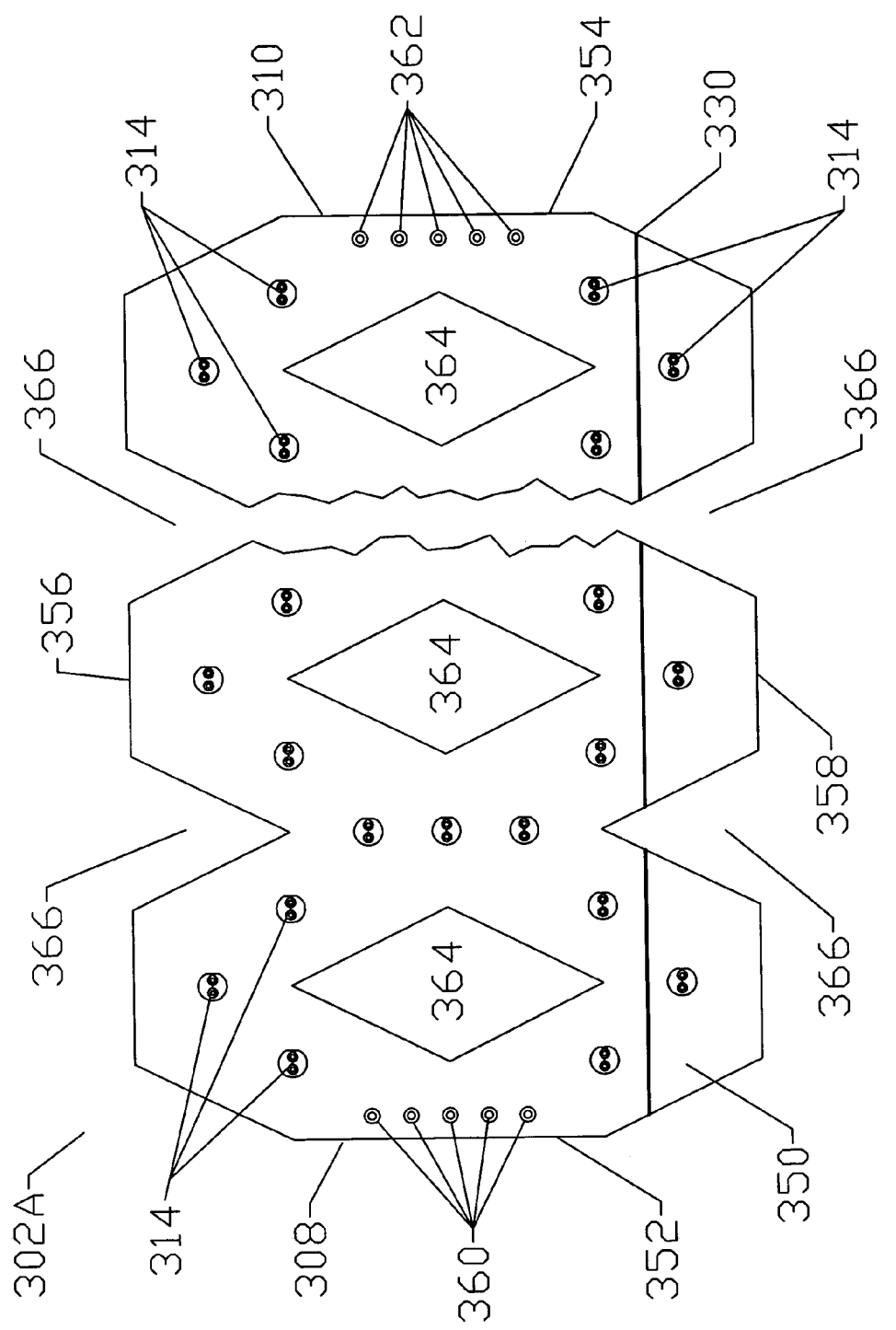
FIG. 24 is a top view of a representative segment of the flexible circuit board shown in FIGS. 22 and 23 shown in a flat mode prior to being formed into a cylindrical configuration with LEDs mounted upright and held thereon prior to being rolled into a circular configuration with the topside of the segment of the flat circuit board being the exterior surface of the rolled circuit board prior to being inserted into the tubular housing as shown in FIGS. 22 and 23.

A stiffening member particularly shown as a stiffening wire 330 secured to the entire length of flexible circuit board 302 between circuit board ends 308 and 310 is shown in cross-section in FIGS. 22 and 23. A stiffening wire 332 can be optionally secured to tubular shell 292 between tube ends 308 and 310. Stiffening wires 330 and 332 are also shown in FIGS. 23, 23A, and 24. Stiffening wires 330 and 332 add strength to lighting strip 288 and further provide the rigidity to maintain the entire flexible lighting strip 288 in the shape it is placed, for example, in a curved or looped mode, during the time of its use. Stiffening wires 330 and 332 are preferably made of metal for strength and rigidity, and as such can be electrically connected to the common or the negative DC voltage lead of each LED 314. Also, when stiffening wires 330 and 332 are made of an electrically conductive metal, they can act as a heat sink to draw the heat generated by the LEDs 314. Such electrically conductive metal can be, for example, substantially aluminum or copper. Stiffening wires 330 and 332 are secured to flexible circuit board 302 and tubular shell 292 respectively, by any suitable means known in the art including gluing, soldering, or other securing means.

FIG. 22 shows a plurality of cutouts 334 as defined by circuit board 302 between interior and exterior surfaces 304 and 306. Cutouts 334 are located at regular intervals between circuit board ends 308 and 310. Cutouts 334 are of sufficient size and of advantageous dimensions to pass stray light from the LEDs 314 from cylindrical hollow 328 to the exterior of lighting strip 288 and allow for the bending of flexible circuit board 302. The configuration of cutouts 334 which are conformed in curved cylindrical alignment with circuit board 302 is such that cutouts 334 have two pairs of opposed acute angles. Cutouts 334 are of sufficient size and quantity to pass stray light from LEDs 314 from cylindrical hollow 328 yet are of such dimensions that the integrity of the strength of circuit board 302 is maintained. Other advantageous configurations and number of cutouts 334 can be used.

As can be seen in FIG. 23A, a reflective coating 336 is preferably applied to interior surface 304 of flexible circuit board 302. A reflective coating 336A can also be applied to exterior surface 306. Reflective coatings 336 and 33A serve to reflect any stray light from LEDs 314.

Fully assembled LED flexible lighting strip 288 includes hardware connectors as described as follows with reference to FIGS. 22A and 22B. Connector end caps 298 and 300 as previously described are mounted to opposed tube ends 294 and 296. An indoor/outdoor male pin connector 338 is mounted to connector end cap 298 and an indoor/outdoor female socket connector 340 is mounted to connector end cap 300. A removable dust cap cover 342 with a flexible cap holder 344 can be mounted to male pin connector 338 as is shown in FIG. 22A. Female socket connector 340 includes a removable dust cap cover 346 with a flexible cap holder 348 connected to female socket connector 340 as is shown in FIG. 22B.

The electrical circuitry mounted on flexible circuit board 302 and LEDs 314 electrically connected thereto is in accordance with and analogous to the electrical wiring diagrams shown in FIGS. 10, 11, and 12 described earlier in relation to flexible helical circuit board 24 of flexible lighting strip 10.

FIG. 24 is a broken segment of a flat mode circuit board 302A of the entire cylindrical flexible circuit board 302 prior to the assembled mode. In particular, flat mode circuit board 302A is shown prior to being made cylindrical and inserted, or pulled into tubular housing 290 in the manufacturing process, or assembly of flexible lighting strip 288 with the flat topside 350 shown. Flat mode circuit board 302A includes opposed linear short edges 352 and 354 and opposed linear long edges 356 and 358. LEDs 314 are shown in an upright position with LED base portions 316 connected to the topside 350 of flat mode circuit board 302A with lens portions 320 extending upwardly. Five power inputs 360 are shown mounted at linear short side edge 352. Power inputs 360 are analogous to power inputs 56 shown in FIGS. 10, 11, and 12 of flexible lighting strip 10. Power inputs 360 are connected to an external LED power supply and controller (not shown). Five power outputs 362 are mounted at opposed linear short edge 354 of flat mode circuit board 302A. Power outputs 362 are analogous to power outputs 58 shown in FIGS. 10, 11, and 12.

The electrical power for flexible LED lighting strip 288 is analogous to that shown in FIG. 10 for flexible lighting strip 10 which is a schematic electrical circuit diagram showing the external power supply and controller 57 for a chasing circuit for the LEDs 36A shown in FIG. 7 for the most part mounted onto the flat mode circuit board 24C. External LED power supply and controller 57 provides two separate control voltages W1 and W2 to drive LEDs 36A, which are analogous to the power, supply and controller for LED lighting strip 288. A single LED 36A is connected in a parallel configuration with other single white LED 36A. Because voltages W1 and W2 are independent of each other, they can be turned on and off individually and at full intensity to create an alternating chasing effect. Also, the external LED power supply and controller 57 can vary the voltages W1 and W2, thereby varying the current going into each LED 36A. This in turn will cause all LEDs 36A connected to voltages W1 or W2 to dim and/or to fade. An analogous power configuration is likewise supplied for LED lighting strip 288.

LEDs 314 can optionally be white light LEDs or color LEDs that is, RGBY LEDs. In the latter case an analogous schematic electrical circuit diagram can be applied for RGBY LEDs such as shown in FIGS. 11 and 12. It is to be understood that the same electrical schematic relationship as shown for the RGBY SMD LEDs 36C shown in FIG. 9 that refers to flexible LED lighting strip 10 also apply to LEDs 314 of flexible lighting strip 288. Power inputs 360 and power outputs 362 indicated in FIG. 24 have reference to the power inputs and outputs as described herein in reference to FIGS. 1I and 12.

A method for making flexible LED lighting strip 288 includes the following steps:

1. Providing a biasable flat circuit board represented as flat mode circuit board 302A having a flat topside 350 and opposed linear short edges 352 and 354 and opposed linear long edges 356 and 358, the flat mode circuit board 302A further including a stiffening member such as stiffening wire 330 secured to topside 350 with flat mode circuit board 302A located between long edges 356 and 358 and extending between short edges 352 and 354. Flat mode circuit board 302A defines a plurality of diamond shaped cutouts 364 located at regular intervals between short edges 352 and 354, and further defining a plurality of semi-diamond shaped cutouts 366 opening at long edges 356 and 358 that are directly opposed one to the other generally midway between diamond shaped cutouts 364 relative to long edges 356 and 358 of flat mode circuit board 302A;

2. Mounting electrical circuitry including traces, solder pads, plated through holes and vias, and related electronic components in preparation for a plurality of LEDs 314 to be mounted to the flat mode circuit board 302A;

3. Securing the plurality of LEDs 314 in a manner known in the art to the flat mode circuit board 302A between long edges 352 and 354 and extending generally between the short edges 352 and 354, the LEDs 314 having LED centerlines 322 perpendicular to flat mode circuit board 302A;

4. Connecting the LEDs 314 to the electrical circuitry;

5. Providing a translucent flexible hollow tubular housing 290 having a tubular housing length and a tubular housing inner diameter;

6. Forming the biasable flat circuit board 302A into a biased mode tightly rolled flexible circuit board 302 having a rolled cylindrical circuit board length that is generally equal to the tubular housing length with the flat topside 350 as shown in FIG. 24 being the exterior surface 306 of the rolled flexible circuit board 302 and the flat bottom side opposed to flat top side 350 becoming the interior surface 304 of the assembled cylindrical flexible circuit board 302A, the LEDs 314 being outwardly directed from the coextensive axis 312 of the hollow tubular housing 290, the operative outer diameter of the tightly rolled and cylindrical flexible circuit board 302 being less than the inner diameter of the tubular housing 290;

7. Pulling the tightly rolled and cylindrical flexible circuit board 302 into the tubular housing 290 and aligning the length of the rolled flexible circuit board 302 with the length of the tubular housing 290 and releasing the rolled flexible circuit board 302 from its biased mode wherein the rolled flexible circuit board 302 now becomes the partly rolled and cylindrical flexible circuit board 302 shown in FIGS. 22 and 23, and wherein the lens portions 320 of the outwardly directed LEDs 314 are adjacent to and in biased contact with the interior surface 326 of the tubular housing 290 and the centerlines of the outwardly directed LEDs 314 are perpendicular to the coextensive axis 312;

8. Securing power input and power output terminals to the electrical circuitry of the assembled flexible circuit board 302 and the LEDs 314;

9. Securing opposed end caps 298 and 300 to the opposed ends 294 and 296 of the tubular housing 290.

10. Mounting a male pin connector 338 to end cap 298;

11. Mounting a female socket connector 340 to end cap 300; and

12. Mounting an optional removable cap cover 342 to the male pin connector 338 and an optional removable cap cover 346 to female socket connector 340.

It will be appreciated that various modifications and changes can be made of the invention described in the foregoing specification and as defined in the appended claims.

What is claimed is:

1. A flexible lighting device, comprising:
an elongated translucent flexible cylindrical tube with opposed tube ends,
a flexible circuit board positioned in said tube extending between said opposed tube ends, said flexible circuit board having an exterior surface and an interior surface, said interior surface defining an elongated continuous chamber between said opposed tube ends,
said flexible circuit board defining a plurality of cutouts between said interior and exterior surfaces between said tube ends, said cutouts being of such shape that allow the bending of said flexible circuit board,
a source of input electrical power,
a source of output electrical power,
electrical circuitry mounted to said flexible circuit board and connected to said input source of electrical power and to said output source of electrical power,
a plurality of LEDs mounted to said flexible circuit board and electrically connected to said electrical circuitry, wherein light emitted from said LEDs can pass at least in part through said cutouts and out said tube.

2. The flexible device as recited in claim 1, wherein said tube has a tube axis and said flexible circuit board axis, said tube axis and said flexible circuit board axis defining a coextensive axis.

3. The flexible lighting device as recited in claim 2, wherein said plurality of LEDs has center lines that are perpendicular to said coextensive axis.

4. The flexible lighting device as recited in claim 3, wherein said tube has a cylindrical inner, said cylindrical exterior surface of said flexible circuit board and said cylindrical inner side of said tube define an elongated ring-shaped space, said plurality of LEDs including a pluralities of inwardly directed LEDs positioned within said cylindrical chamber wherein light beams from said inwardly directed LEDs extend through said cutouts and out said tube.

5. The flexible lighting device as recited in claim 3, wherein said tube has a cylindrical inner side, said cylindrical exterior surface of said flexible circuit board and said cylindrical inner side of said tube defines an elongated ring-shaped space, said plurality of LEDs including a plurality of outwardly directly LEDs positioned within aid ring-shaped space wherein light beams from said outwardly directed LEDs extend directly out said tube.

6. The flexible lighting device as recited in claim 5, wherein said LEDs have LED lens portions that are juxtaposed with said cylindrical inner side of said tube.

7. The flexible lighting device as recited in claim 1, wherein said flexible circuit board has a length and wherein said cutouts are generally equal in size and are located at alternated opposed equal intervals along said length.

8. The flexible lighting device as recited in claim 1, wherein said flexible circuit further includes means for providing strength to said flexible lighting device, said means for providing strength being secured to said flexible circuit board.

9. The flexible lighting device as recited in claim 8, wherein said means for providing strength is combined with a means for providing rigidity to maintain the shape of said flexible lighting device when said flexible lighting device is set in a plurality of various positions.

10. The flexible lighting device as recited in claim 9, wherein said means for providing strength and for providing rigidity includes at least one shape-retaining element secured to said flexible circuit board between said circuit board ends.

11. The flexible lighting device as recited in claim 10, wherein said at least one shape-retaining element is at least one flexible wire.

12. The flexible lighting device as recited in claim 11, wherein said at least one flexible wire is two flexible wires.

13. The flexible lighting device as recited in claim 9, wherein said means for providing strength and for providing rigidity includes at least one shape-retaining element secured to said flexible tube between said tube ends.

14. The flexible lighting device as recited in claim 10, wherein said means for providing strength and means for providing rigidity is at least one flexible electrically conductive metal wire, wherein said electrically conductive metal wire acts as a heat sink to draw the heat generated by said plurality of LEDs away from said LEDs.

15. The flexible lighting device as recited in claim 14, wherein said electrically conductive metal wire is substantially aluminum.

16. The flexible lighting device as recited in claim 14, wherein said electrically conductive metal wire is substantially copper.

17. The flexible lighting device as recited in claim 1, wherein said flexible circuit board is made of an electrically non-conductive material.

18. The flexible lighting device as recited in claim 17, wherein said electrically non-conductive material is an electronically non-conductive plastic.

19. The flexible lighting device as recited in claim 18, wherein said electrically non-conductive plastic is a polyimide.

20. The flexible lighting device as recited in claim 1, further including opposed end caps connected to said opposed tube ends.

21. The flexible light device as recited in claim 1, wherein said plurality of LEDs are white LEDs.

22. The flexible lighting device as recited in claim 21, wherein said electrical circuitry includes a chasing circuit for said white LEDs.

23. The flexible lighting device as recited in claim 1, wherein said plurality of LEDs are color LEDs.

24. The flexible lighting circuit as recited in claim 23, wherein said electrical circuitry includes color mixing, color changing, and color chasing control for said color LEDs.

25. The flexible lighting device as recited in claim 1, wherein said plurality of LEDs are color surface mount device (SMD) LEDs.

26. The flexible lighting device as recited in claim 25, wherein said electrical circuitry includes color mixing, color changing, and color chasing control for said color surface mount device (SMD) LEDs.

27. The flexible lighting device as recited in claim 23, wherein said color LEDs are Red, Green, Blue, and Yellow LEDs.

28. The flexible lighting device as recited in claim 25, wherein said color surface mount device (SMD) LEDs are Red, Green, Blue, and Yellow LEDs.

29. A method for making a flexible LED lighting strip that includes the following steps:
   a. providing a biasable flat circuit board having an upper surface and a lower surface and opposed linear short edges and opposed linear long edges, the flat circuit board defining a plurality of diamond-shaped cutouts located at regular intervals between the short edges and further defining a plurality of semi-diamond-shaped cutouts opening at the long edges that are directly opposed one to the other generally midway between the diamond-shaped cutouts opening at the long edges;
   b. mounting electrical circuitry including trades, solder pads, plated through holes and vias, and related electronic components in preparation for a plurality of LEDs to be mounted to the flat circuit board;
   c. securing the plurality of LEDs to the flat circuit board between the long edges and extending generally between the short edges, the LEDs having LED center lines perpendicular to the flat circuit board.
   d. connecting the LEDs to the electrical circuitry;
   e. providing a translucent flexible hollow tube having a tube length and a tube inner diameter;
   f. forming the biasable flat circuit board into a biased mode tightly rolled circuit board having a cylindrical circuit board length that is generally equal to the tube length with the upper surface of the flat circuit board being the interior surface of the cylindrical circuit board and the lower surface of the flat circuit board being the exterior surface of the cylindrical circuit board, the LEDs being inwardly directed to the axis of the hollow tube; and
   g. pulling the tightly rolled circuit board into the tube and aligning the length of the rolled circuit board with the length of the tube and releasing the rolled circuit board from its biased mode wherein the rolled circuit board now becomes a partly rolled and cylindrical circuit board, and wherein the base portions of the inwardly directed LEDs are adjacent to the inner surface of assembled circuit board and the center lines of the inwardly directed LEDs are perpendicular to the axis of the tube.

30. The method as recited in claim 29, further including the following steps:
   a. securing power input and power output terminals to the electrical circuitry of the assembled circuit board of the LEDs; and
   b. securing opposed end caps to the opposed ends of the tube.

31. The method as recited in claim 30, further including the steps of:
   a. mounting a male pin connector to one of the end caps;
   b. mounting a female socket connector to the other of the end caps; and
   c. mounting an optional removable cap cover to the male pin connector and another optional removal cap cover to the female socket connector.

32. A method for making a flexible LED light strip that includes the following steps:
   a. providing a biasable flat circuit board having an upper surface and a lower surface and opposed linear short edges and opposed linear long edges, the flat circuit board defining a plurality of diamond-shaped cutouts located at regular intervals between the short edges and further defining a plurality of semi-diamond-shaped cutouts opening at the long edges that are directly opposed one to the other generally midway between the diamond-shaped cutouts opening at the long edges;
   b. mounting electrical circuitry including traces, solder pads, plated through holes and vias, and related electronic components in preparation for a plurality of LEDs to be mounted to the flat circuit board;

c. securing the plurality of LEDs to the flat circuit board between the long edges and extending generally between the short edges, the LEDs having LED center lines perpendicular to the flat circuit board;
d. connecting the LEDs to the electrical circuitry;
e. providing a translucent flexible hollow tube having a tube length and a tube inner diameter;
f. forming the biasable flat circuit board into a biased mode tightly rolled circuit board having a cylindrical circuit board length that is generally equal to the tube length with the upper surface of the flat circuit board, the LEDs being outward directed from the axis of the hollow tube; and
g. pulling the tightly rolled circuit board into the tube and aligning the length of the rolled circuit board with the length of the tube and releasing the rolled circuit board from its biased mode wherein the rolled circuit board now becomes a partly rolled and cylindrical circuit board, wherein the lens portions of the outwardly directed LEDs are adjacent to the inner side of the tube and the center lines of the outwardly directed LEDs are perpendicular to the axis of the tube.

33. The method as recited in claim 32, further including the following steps:
   a. securing power input and power output terminals to the electrical circuitry of the assembled circuit board and the LEDs; and
   b. securing opposed end caps to the opposed ends of the tube.

34. The method as recited in claim 33, further including the steps of:
   a. mounting a male pin connector to one of the end caps;
   b. mounting a female socket to the other of the end caps; and
   c. mounting an optional removal cap cover to the male pin connector and another optional removable cap cover to the female socked connector.

* * * * *